(12) United States Patent
Fukuura

(10) Patent No.: US 9,263,630 B2
(45) Date of Patent: Feb. 16, 2016

(54) INORGANIC LAYER LIGHT-EMITTING DEVICE

(71) Applicant: SUMITOMO CHEMICAL COMPANY, LIMITED, Chuo-ku, Tokyo (JP)

(72) Inventor: Tomohiro Fukuura, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/386,104

(22) PCT Filed: Mar. 13, 2013

(86) PCT No.: PCT/JP2013/057007
§ 371 (c)(1),
(2) Date: Sep. 18, 2014

(87) PCT Pub. No.: WO2013/146268
PCT Pub. Date: Oct. 3, 2013

(65) Prior Publication Data
US 2015/0041842 A1 Feb. 12, 2015

(30) Foreign Application Priority Data

Mar. 27, 2012 (JP) .................................. 2012-071685

(51) Int. Cl.
*H01L 33/00* (2010.01)
*H01L 33/06* (2010.01)
(Continued)

(52) U.S. Cl.
CPC ................ *H01L 33/06* (2013.01); *H01L 33/04* (2013.01); *H01L 33/502* (2013.01); *H05B 33/14* (2013.01); *H01L 33/22* (2013.01); *H01L 33/46* (2013.01)

(58) Field of Classification Search
CPC ......... H01L 33/04; H01L 33/06; H01L 33/46; H01L 33/22; H05B 33/14
USPC ............................................................ 257/98
See application file for complete search history.

(56) References Cited

U.S. PATENT DOCUMENTS

| 5,866,433 A | 2/1999 | Schalkhammer et al. |
| 6,074,575 A | 6/2000 | Sugioka et al. |

(Continued)

FOREIGN PATENT DOCUMENTS

| CN | 1527648 A | 9/2004 |
| CN | 101728486 A | 6/2010 |

(Continued)

OTHER PUBLICATIONS

Society of Powder Technology, "Particle Measurement Technique," Nikkan Kogyo Shimbun, Ltd., Nov. 30, 1994, pp. 5-8.

(Continued)

*Primary Examiner* — Elias M Ullah
(74) *Attorney, Agent, or Firm* — Sughrue Mion, PLLC

(57) ABSTRACT

There is provided an inorganic layer light-emitting device including: a light-emitting layer including an emission body made of an inorganic material; and a metal-based particle assembly layer being a layer consisting of a particle assembly including 30 or more metal-based particles separated from each other and disposed in two-dimensions, said metal-based particles having an average particle diameter in a range of from 200 to 1600 nm, an average height in a range of from 55 to 500 nm, and an aspect ratio in a range of from 1 to 8, and said metal-based particles that compose said metal-based particle assembly layer are disposed such that an average distance between adjacent metal-based particles is in a range of from 1 to 150 nm. The inorganic layer light-emitting device exhibits high luminous efficiency through emission enhancement and improvement in light extraction efficiency.

33 Claims, 13 Drawing Sheets

(51) Int. Cl.
*H01L 33/04* (2010.01)
*H05B 33/14* (2006.01)
*H01L 33/50* (2010.01)
*H01L 33/22* (2010.01)
*H01L 33/46* (2010.01)

(56) References Cited

U.S. PATENT DOCUMENTS

| | | |
|---|---|---|
| 7,705,989 B2 | 4/2010 | Chaton et al. |
| 2005/0088078 A1 | 4/2005 | Tseng et al. |
| 2006/0032529 A1 | 2/2006 | Rand et al. |
| 2006/0279738 A1 | 12/2006 | Ogawa et al. |
| 2007/0114523 A1 | 5/2007 | Oumi et al. |
| 2007/0115474 A1 | 5/2007 | Chaton et al. |
| 2008/0007852 A1 | 1/2008 | Kawasaki |
| 2008/0135739 A1 | 6/2008 | Kim et al. |
| 2008/0206565 A1 | 8/2008 | Takahashi et al. |
| 2009/0079988 A1 | 3/2009 | Narahara et al. |
| 2009/0122310 A1 | 5/2009 | Zhang et al. |
| 2009/0213368 A1 | 8/2009 | Roper et al. |
| 2009/0257062 A1 | 10/2009 | Rubinstein et al. |
| 2010/0022020 A1 | 1/2010 | Halas et al. |
| 2010/0046077 A1 | 2/2010 | Lee et al. |
| 2010/0126567 A1 | 5/2010 | Kaufman |
| 2010/0149540 A1 | 6/2010 | Boukherroub et al. |
| 2010/0309539 A1 | 12/2010 | Kaye et al. |
| 2011/0024779 A1 | 2/2011 | Nakamura et al. |
| 2011/0267614 A1 | 11/2011 | Reinhard et al. |
| 2012/0025185 A1 | 2/2012 | Kasamatsu |
| 2012/0032530 A1 | 2/2012 | Hyde et al. |
| 2012/0043532 A1 | 2/2012 | Yasuda et al. |
| 2012/0325301 A1 | 12/2012 | Misawa et al. |
| 2013/0081683 A1 | 4/2013 | Masunaga et al. |
| 2013/0213477 A1 | 8/2013 | Nakayama et al. |
| 2014/0008636 A1 | 1/2014 | Fukuura |
| 2014/0011043 A1 | 1/2014 | Fukuura |
| 2014/0017507 A1 | 1/2014 | Fukuura |
| 2014/0037977 A1 | 2/2014 | Fukuura |

FOREIGN PATENT DOCUMENTS

| | | |
|---|---|---|
| CN | 101790899 A | 7/2010 |
| EP | 2203030 A1 | 6/2010 |
| EP | 2217913 | 8/2010 |
| EP | 2693844 A1 | 2/2014 |
| EP | 2693845 A1 | 2/2014 |
| EP | 2693846 A1 | 2/2014 |
| JP | 08-134440 A | 5/1996 |
| JP | 8-271431 A | 10/1996 |
| JP | 2004-235140 A | 8/2004 |
| JP | 2007-17432 A | 1/2007 |
| JP | 2007-501391 A | 1/2007 |
| JP | 2007-139540 A | 6/2007 |
| JP | 2007-165284 A | 6/2007 |
| JP | 2007-335222 A | 12/2007 |
| JP | 2008-214363 A | 9/2008 |
| JP | 2008-243669 A | 10/2008 |
| JP | 2009-74947 A | 4/2009 |
| JP | 2010-238406 A | 10/2010 |
| JP | 2010-238775 A | 10/2010 |
| JP | 2013-110395 A | 6/2013 |
| WO | 2005/017570 A2 | 2/2005 |
| WO | 2005/033335 A2 | 4/2005 |
| WO | 2006/085515 A1 | 8/2006 |
| WO | 2008/082569 A1 | 7/2008 |
| WO | 2010113469 A1 | 10/2010 |
| WO | 2011/027830 A1 | 3/2011 |
| WO | 2011/125101 A1 | 10/2011 |
| WO | 2012/042831 A1 | 4/2012 |
| WO | 2012/133776 A1 | 10/2012 |
| WO | 2012/133777 A1 | 10/2012 |
| WO | 2012/133778 A1 | 10/2012 |
| WO | 2012/133779 A1 | 10/2012 |

OTHER PUBLICATIONS

European Search Report in Application No. EP 12765934.0 dated Oct. 10, 2014.
Extended European Search Report issued Aug. 19, 2014 in European Patent Application No. 12764739.4.
International Search Report for PCT/JP2012/058597 mailed Jun. 5, 2012.
International Search Report for PCT/JP2012/075059 mailed Dec. 25, 2012.
International Search Report for PCT/JP2012/058600 mailed Jun. 5, 2012.
International Search Report for PCT/JP2012/077095 mailed Nov. 20, 2012.
Julie S. Biteen, et al., "Plasmon-Enhanced Photoluminescence of Silicon Quantum Dots: Simulation and Experiment", J. Phys. Chem. C, 2007, vol. 111, No. 36, pp. 13372-13377.
Communication dated Jun. 3, 2015 from the State Intellectual Property Office of People's Republic of China in Application No. 201280016534.2.
Office Action issued on Mar. 17, 2015 in U.S. Appl. No. 14/007,113.
W. Li, S. Pan and L. J. Rothberg, "Emissive Efficiency Enhancement of Alq3 and Prospects for Plasmon-enhanced Organic Electroluminescence" in Plasmonics: Metallic Nanostructures and Their Optical Properties VI, edited by Mark I. Stockman; Proc.of SPIE, vol. 7032, pp. 703224-1-703224-7 (2008).
Wen Liu, "Surface plasmon enhanced GaAs thin film solar cells", Solar Energy Materials & Solar Cells, 2011, vol. 95, pp. 693-698.
Office Action issued on Dec. 2, 2014 in U.S. Appl. No. 14/007,107.
Office Action issued on Aug. 15, 2014 in U.S. Appl. No. 14/007,107.
Notice of Allowance issued on Jun. 16, 2015 in U.S. Appl. No. 14/007,107.
Communication dated Jul. 15, 2015 from the State Intellectual Property Office of People's Republic of China in Application No. 201280051976.0.
Communication dated Jul. 17, 2015 from the State Intellectual Property Office of People's Republic of China in Application No. 201280016444.3.
D. Duche et al., "Improving light absorption in organic solar cells by plasmonic contribution", Elsevier, Solar Energy Materials & Solar Cells, vol. 93, (2009), pp. 1377-1382.
Communication dated Aug. 11, 2015 from the European Patent Office in European Application No. 12844347.0.
Tomohiro Fukuura et al., "Long Range Enhancement of Molecular Fluorescence by Closely Packed Submicro-scale Ag Islands," e-Journal of Surface Science and Nanotechnology, May 23, 2009, pp. 653-659, vol. 7.
George Chumanov et al., "Unusual Extinction Spectra of Nanometer-Sized Silver Particles Arranged in Two-Dimensional Arrays," J. Phys. Chem., 1996, pp. 5166-5168, vol. 100.
Jiha Sung et al., "Nanoparticle Spectroscopy: Plasmon Coupling in Finite-Sized Two-Dimensional Arrays of Cylindrical Silver Nanoparticles," J. Phys. Chem. C, 2008, pp. 4091-4096, vol. 112.
K. Lance Kelly et al., "The Optical Properties of Metal Nanoparticles: The Influence of Size, Shape, and Dielectric Environment," J. Phys. Chem. B, 2003, pp. 668-677, vol. 107.
International Search Report of PCT/JP2013/057007 dated Apr. 16, 2013.
Office Action dated Sep. 21, 2015, issued by the Intellectual Property Office of Taiwan in counterpart Taiwanese Patent Application No. 101111532.
Communication dated Dec. 15, 2015 from the Japanese Patent Office in counterpart application No. 2012-071680.
Communication dated Nov. 16, 2015 from the United States Patent and Trademark Office in counterpart U.S. Appl. No. 14/007,113.
Communication dated Nov. 30, 2015 from the United States Patent and Trademark Office in counterpart U.S. Appl. No. 14/007,107.
Yang et al., Jul. 13, 2010, "Engineering Nanoparticle Cluster Arrays for Bacterial Biosensing: The Role of the Building Block in Multiscale SERS Substrates", Adv. Funct. Mater., vol. 20, pp. 2619-2628.

(a)

(b)

(b)

(a)

INORGANIC LAYER LIGHT-EMITTING DEVICE

CROSS REFERENCE TO RELATED APPLICATIONS

This is a National Stage of International Application No. PCT/JP2013/057007 filed Mar. 13, 2013, claiming priority based on Japanese Patent Application No. 2012-071685 filed Mar. 27, 2012, the contents of all of which are incorporated herein by reference in their entirety.

TECHNICAL FIELD

The present invention relates to an inorganic layer light-emitting device, such as an inorganic LED device (inorganic light-emitting diode device), an inorganic EL device (inorganic electroluminescence device), and the like, exploiting plasmon resonance of a metal-based particle assembly in aiming for enhanced emission.

BACKGROUND ART

It has conventionally been known that making metal particles small to be nano-sized presents functions that are not observed when it is in a bulk state, and "localized plasmon resonance" is in particular expected for application. Plasmon is a compressional wave of free electrons that arises by collective oscillation of the free electrons in a metallic nanostructure.

In recent years, a field of art handling the plasmon is referred to as "plasmonics" and attracts large attention, and has also been actively studied and such study includes exploiting phenomena of localized plasmon resonance of a metal nanoparticle to be intended for improvements of light-emitting devices in luminous efficiency.

For example, Japanese Patent Laying-Open No. 2007-139540 (PTD 1) discloses a technique exploiting localized plasmon resonance for enhanced fluorescence of fluorescent substance, and Japanese Patent Laying-Open No. 2010-238775 (PTD 2) discloses an electroluminescence device (EL device) in which core shell type microparticles, each composed of a metallic microparticle core and an insulator shell covering the core, capable of inducing localized plasmon are arranged in a vicinity of or inside a light emitting region. Furthermore, T. Fukuura and M. Kawasaki, "Long Range Enhancement of Molecular Fluorescence by Closely Packed Submicro-scale Ag Islands", e-Journal of Surface Science and Nanotechnology, 2009, 7, 653 (NPD 1) indicates a study on localized plasmon resonance of silver nanoparticles.

CITATION LIST

Patent Document

PTD 1: Japanese Patent Laying-Open No. 2007-139540
PTD 2: Japanese Patent Laying-Open No. 2010-238775

Non Patent Document

NPD 1: T. Fukuura and M. Kawasaki, "Long Range Enhancement of Molecular Fluorescence by Closely Packed Submicro-scale Ag Islands", e-Journal of Surface Science and Nanotechnology, 2009, 7, 653

SUMMARY OF INVENTION

Technical Problem

Under the present circumstances, luminous efficiency of an inorganic LED device or an inorganic EL device to which metal nanoparticles are applied as a plasmonic material remains relatively low because of the following reason, thus improvement thereof is strongly desired. In other words, in the emission enhancement using localized plasmon resonance via conventional metal nanoparticles, an emission enhancement effect through plasmon resonance itself was not relatively strong, and also a range of the emission enhancement effect (an effective range of localized plasmon resonance) is significantly narrow. Therefore, there has been a problem that an emission enhancement effect could be obtained at a small fraction of the light-emitting layer, thus enough emission enhancement effect could not be obtained.

For the purpose of addressing such a disadvantage, it can be considered to dispose metal nanoparticles in a vicinity of or inside the light-emitting layer as described in PTD 2. However, in this case, at least a part of emitted light is reflected toward a direction different from a light extraction face at an interface of each layer disposed between metal nanoparticles and the light extraction face, thereby causing a problem of lowering a light extraction efficiency. Moreover, it can be considered to decrease a thickness of a layer interposed between the metal nanoparticles and the light extraction face (for example, a clad layer) to arrange the metal nanoparticles in a vicinity of the light extraction face and shorten a distance between a light-emitting layer and the metal nanoparticles. However, it is difficult to decrease a thickness to an extent that the emission enhancement effect is applied entirely on the light-emitting layer while maintaining the function of the interposing layer.

Therefore, an object of the present invention is to provide an inorganic layer light-emitting device exhibiting high luminous efficiency through emission enhancement and improvement in the light extraction efficiency through a novel plasmonic material.

Solution to Problem

PTD 1 (see paragraphs [0010] to [0011]) provides a theoretical explanation of a relationship between emission enhancement through localized plasmon resonance and a metallic nanoparticle's particle diameter, and according to this explanation, when a spherical silver particle having a particle diameter of approximately 500 nm is used, while luminous efficiency $\phi$ of approximately 1 is theoretically provided, in reality such a silver particle does not present a substantial effect to enhance emission. Such a large-size silver particle does not present a substantial effect to enhance emission because it is inferred that the silver particle has an excessively large number of surface free electrons therein, and accordingly, dipole-type localized plasmon observed in a typical nanoparticle (a nanoparticle having a relatively small particle diameter) is not easily generated. It is believed, however, that if a significantly large number of surface free electrons that the large-size nanoparticle has therein can be effectively excited as plasmon, it would be expected to contribute to drastically more effective enhancement via the plasmon.

As a result of a diligent study, the present inventor has found that when a large-sized metal-based particle generally believed to provide a small emission enhancement effect, as set forth above, is formed to have a specific shape and at least a specific number of such particles are mutually separated in two dimensions and thus disposed to form a metal-based particle assembly, the assembly surprisingly can not only present significantly intense plasmon resonance but also allows the plasmon resonance to have an effect over a significantly extended range (or a plasmonic enhancement effect to cover the range) and that a layer (or film) that is formed of the metal-based particle assembly is introduced into a quantum dot light-emitting device, whereby luminous efficiency can be drastically improved.

More specifically, the present invention includes the following:

[1] An inorganic layer light-emitting device comprising:
a light-emitting layer including an emission body made of an inorganic material; and
a metal-based particle assembly layer being a layer consisting of a particle assembly including 30 or more metal-based particles separated from each other and disposed in two-dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8,
said metal-based particles that compose said metal-based particle assembly layer being disposed such that an average distance between adjacent metal-based particles is in a range of from 1 to 150 nm.

[2] An inorganic layer light-emitting device comprising:
a light-emitting layer including an emission body made of an inorganic material; and
a metal-based particle assembly layer being a layer consisting of a particle assembly including 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8,
said metal-based particle assembly layer having in an absorption spectrum for a visible light region a maximum wavelength of a peak at a longest side in wavelength, and the maximum wavelength shifts toward a shorter side in wavelength in a range of from 30 to 500 nm as compared with that of a reference metal-based particle assembly (X) in which metal-based particles having a particle diameter equal to said average particle diameter and a height equal to said average height and made of the same material are disposed such that each distance between adjacent metal-based particles is in a range of from 1 to 2 μm.

[3] An inorganic layer light-emitting device comprising:
a light-emitting layer including an emission body made of an inorganic material; and
a metal-based particle assembly layer being a layer consisting of a particle assembly including 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8,
said metal-based particle assembly layer having in an absorption spectrum for a visible light region a maximum wavelength of a peak at a longest side in wavelength, and an absorbance at the maximum wavelength is higher as compared with that of a reference metal-based particle assembly (Y) in which metal-based particles having a particle diameter equal to said average particle diameter and a height equal to said average height and made of the same material are disposed such that each distance between adjacent metal-based particles is in a range of from 1 to 2 μm, on the premise that the numbers of the metal-based particles are the same.

[4] The inorganic layer light-emitting device according to any one of items [1] to [3], wherein said metal-based particles that compose said metal-based particle assembly layer are oblate particles with said aspect ratio of more than 1.

[5] The inorganic layer light-emitting device according to any one of items [1] to [4], wherein said metal-based particles that compose said metal-based particle assembly layer are made of silver.

[6] The inorganic layer light-emitting device according to any one of items [1] to [5], wherein said metal-based particles that compose said metal-based particle assembly layer are non-conductive between adjacent metal-based particles.

[7] The inorganic layer light-emitting device according to any one of items [1] to [6], wherein said metal-based particle assembly layer has in an absorption spectrum for a visible light region a maximum wavelength of a peak at a longest side in wavelength, and the maximum wavelength is in a range of from 350 to 550 nm.

[8] The inorganic layer light-emitting device according to any one of items [1] to [7], wherein said metal-based particle assembly layer has in an absorption spectrum for a visible light region a maximum wavelength of a peak at a longest side in wavelength, and an absorbance at the maximum wavelength is at least 1.

[9] The inorganic layer light-emitting device according to any one of items [1] to [8], further comprising an insulating layer interposed between said light-emitting layer and said metal-based particle assembly layer.

[10] The inorganic layer light-emitting device according to item [9], wherein said insulating layer is formed so as to cover a surface of each metal-based particle that composes said metal-based particle assembly layer.

[11] The inorganic layer light-emitting device according to any one of items [1] to [10], wherein a thickness of said light-emitting layer is at least 1 nm.

[12] The inorganic layer light-emitting device according to any one of items [1] to [11], wherein a distance between a light-emitting layer side surface of said metal-based particle assembly layer and said light-emitting layer is at least 10 nm.

[13] The inorganic layer light-emitting device according to any one of items [1] to [12], wherein a distance between a light-emitting layer side surface of said metal-based particle assembly layer and said light-emitting layer is at least 20 nm, and said emission body contained in said light-emitting layer has a photoluminescence quantum yield of 1.5 times or larger than that of a reference inorganic layer light-emitting device that does not have said metal-based particle assembly layer.

[14] A method of enhancing emission of an inorganic layer light-emitting device, the method comprising disposing in said inorganic layer light-emitting device a metal-based particle assembly layer being a layer consisting of a particle assembly including 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8, and metal-based particles are disposed such that an average distance between adjacent metal-based particles may be in a range of from 1 to 150 nm.

[15] A method of enhancing emission of an inorganic layer light-emitting device, the method comprising disposing in said inorganic layer light-emitting device a metal-based particle assembly layer being a layer consisting of a particle assembly including 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8, and said metal-based particle assembly layer has in an absorption spectrum for a visible light region a maximum wavelength of a peak at a longest side in wavelength, and the maximum wavelength shifts toward a shorter side in wavelength in a range of from 30 to 500 nm as compared with that of a reference metal-based particle assembly (X) in which metal-based particles having a particle diameter equal to said average particle diameter and a height equal to said average height and made of the same material are disposed such that each distance between adjacent metal-based particles may be in a range of from 1 to 2 µm.

[16] A method of enhancing emission of an inorganic layer light-emitting device, the method comprising disposing in said inorganic layer light-emitting device a metal-based particle assembly layer being a layer consisting of a particle assembly including 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8, and said metal-based particle assembly layer has in an absorption spectrum for a visible light region a maximum wavelength of a peak at a longest side in wavelength, and an absorbance at the maximum wavelength is higher as compared with that of a reference metal-based particle assembly (Y) in which metal-based particles have a particle diameter equal to said average particle diameter and a height equal to said average height and made of the same material are disposed such that each distance between adjacent metal-based particles may be in a range of from 1 to 2 µm, on the premise that the numbers of the metal-based particles are the same.

In the present invention, the "inorganic layer light-emitting device" is a light-emitting device having a light-emitting layer with an emission body made of an inorganic material, and includes an "inorganic LED device (inorganic light-emitting diode device)" and an "inorganic EL device (inorganic electroluminescence device)." The "inorganic LED device" is an inorganic semiconductor light-emitting device which generates an exciter by implanting an electron and a positive hole to a light-emitting layer to allow the light-emitting layer to emit light, and it is distinguished from the "inorganic EL device" which renders a light-emitting layer to be in an excited state by means of an electron accelerated by an external electric field and emits light when it returns to a ground state.

The light-emitting layer may have a single layer structure or a multilayer structure in which quantum well layers and barrier layers are stacked alternately. In the latter case, the thickness of the light-emitting layer refers to the total thickness of the multilayer structure.

Advantageous Effects of Invention

According to the present invention, a metal-based particle assembly having plasmon characteristic which is not present in conventional plasmonic materials, thus an inorganic layer light-emitting device can be provided, while both emission enhancement and improvement of light extraction efficiency are achieved to exhibit high luminous efficiency.

DESCRIPTION OF EMBODIMENTS

Figure 1:
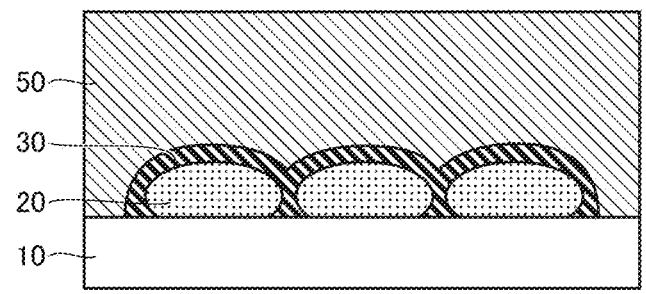
FIG. 1 is a schematic cross section view of an example for an inorganic layer light-emitting device according to the present invention.

The present invention provides an inorganic layer light-emitting device configured to include at least: a light-emitting layer including an emission body made of an inorganic material; and a metal-based particle assembly layer that is a layer (or film) disposed in the inorganic layer light-emitting device and consists of a particle assembly including 30 or more metal-based particles mutually separated and disposed in two dimensions.

In the present invention the metal-based particles that compose the metal-based particle assembly layer have an average particle diameter in a range of from 200 to 1600 nm, an average height in a range of from 55 to 500 nm, and an aspect ratio, as defined by a ratio of the average particle diameter to the average height, in a range of from 1 to 8.

<Metal-Based Particle Assembly Layer>

The inorganic layer light-emitting device of the present invention in a preferable embodiment includes a metal-based particle assembly layer having any of the following features:

[i] the metal-based particles that compose the metal-based particle assembly layer are disposed such that an average distance between adjacent metal-based particles may be in a range of from 1 to 150 nm (First Embodiment);

[ii] the metal-based particle assembly layer has in an absorption spectrum for a visible light region a maximum wavelength of a peak at a longest side in wavelength, and the maximum wavelength shifts toward a shorter side in wavelength in a range of from 30 to 500 nm as compared with that of a reference metal-based particle assembly (X) in which metal-based particles having a particle diameter equal to the average particle diameter and a height equal to the average height and made of the same material are disposed such that each distance between adjacent metal-based particles may be in a range of from 1 to 2 μm (Second Embodiment); and

[iii] the metal-based particle assembly layer has in an absorption spectrum for a visible light region a maximum wavelength of a peak at a longest side in wavelength, and an absorbance at the maximum wavelength is higher as compared with that of a reference metal-based particle assembly (Y) in which metal-based particles having a particle diameter equal to the average particle diameter and a height equal to the average height and made of the same material are disposed such that each distance between adjacent metal-based particles may be in a range of from 1 to 2 μm, on the premise that the numbers of the metal-based particles are the same (Third Embodiment).

In the present specification, a metal-based particle assembly having an average particle diameter and an average height equal to those of reference metal-based particle assembly (X) or (Y) means that the average particle diameters have a difference within a range of ±5 nm and the average heights have a difference within a range of ±10 nm.

First Embodiment

An inorganic layer light-emitting device of the present embodiment including a metal-based particle assembly layer having the feature indicated above at item [i] is significantly advantageous as follows:

(1) The metal-based particle assembly layer according to the present embodiment exhibits significantly intense plasmon resonance and thus allows a stronger emission enhancement effect than a conventional plasmonic material, and hence drastically increased luminous efficiency. The metal-based particle assembly layer according to the present embodiment exhibits plasmon resonance having an intensity that is not a simple sum total of localized plasmon resonances that individual metal-based particles exhibit for a specific wavelength; rather, it exhibits an intensity larger than that. More specifically, 30 or more metal-based particles each having a prescribed shape are spaced as prescribed, as described above, to be closely disposed, thereby individually interacting with each other to exhibit significantly intense plasmon resonance. This is believed to be exhibited as the metal-based particles' localized plasmons interact with each other.

Generally, a plasmonic material is subjected to absorption spectrum measurement through absorptiometry, a plasmon resonance peak (hereinafter also referred to as a plasmon peak) is observed as a peak in an ultraviolet to visible light region, and the plasmon peak's absorbance value in magnitude at a maximum wavelength thereof can be used to easily evaluate the plasmonic material's plasmon resonance in intensity, and when the metal-based particle assembly layer according to the present embodiment that is layered on a glass substrate is subjected to absorption spectrum measurement, it can present for a visible light region a maximum wavelength of a plasmon peak at a longest side in wavelength, and an absorbance at the maximum wavelength can be 1 or larger, further 1.5 or larger, and still further approximately 2.

The metal-based particle assembly layer's absorption spectrum is measured through absorptiometry with the layer layered on a glass substrate. More specifically, the absorption spectrum is obtained as follows: the glass substrate with the metal-based particle assembly layer layered thereon is exposed to light of the ultraviolet to visible light region incident on a back surface thereof (i.e., a side opposite to the metal-based particle assembly layer) in a direction perpendicular to a substrate surface and intensity I of transmitted light omnidirectionally transmitted toward the metal-based particle assembly layer is measured with an integrating sphere spectrophotometer. On the other hand, a substrate which does not have a metal-based particle assembly film and has the same thickness and the same material as the substrate of said metal-based particle assembly film-layered substrate is exposed at a surface thereof to the same incident light as above in a direction perpendicular to that surface and intensity $I_0$ of transmitted light omnidirectionally transmitted through a side opposite to the incident surface is measured with the integrating sphere spectrophotometer. Then, the absorption spectrum's axis of ordinate, or absorbance, is expressed by the following expression:

$$\text{Absorbance} = -\log_{10}(I/I_0)$$

(2) The metal-based particle assembly layer presents plasmon resonance having an effect over a significantly extended range (or a plasmonic enhancement effect covering the range) and thus allows a stronger emission enhancement effect than a conventional plasmonic material, and this, as well as the above, contributes to drastically improved luminous efficiency. The plasmon resonance having an effect over the significantly extended range allows a light-emitting layer having a large thickness to be entirely enhanced at the same time, thereby significantly improving luminous efficiency of the inorganic layer light-emitting device.

Such extension effects are also believed to be exhibited as 30 or more metal-based particles each having a prescribed shape, which are spaced, as prescribed to be closely disposed cause localized plasmons interacting with each other.

According to the metal-based particle assembly layer of the present embodiment, the range of an effect of plasmon resonance can be extended to approximately several hundreds nm.

Thus, the inorganic layer light-emitting device of the present embodiment can achieve effective enhancement via plasmon resonance with the metal-based particle assembly layer disposed at a position for example 10 nm, further several tens nm (e.g., over 20 nm, 30 nm, or 40 nm), still further several hundreds nm away from the light-emitting layer. This means that the plasmonic material, or the metal-based particle assembly layer, can be disposed closer to a light extraction face than the light-emitting layer, and, furthermore, in a vicinity of a light extraction face considerably remote from the light-emitting layer, and significantly efficient extraction of light can thus be achieved. This also contributes to drastic enhancement of luminous efficiency. As described above, in the conventional art in which the plasmonic material is disposed in a vicinity of or inside the light-emitting layer, at least a part of emitted light is reflected toward a direction different from a light extraction face at an interface of each layer disposed between metal nanoparticles and the light extraction face, thereby lowering a light extraction efficiency.

While the metal-based particle assembly layer according to the present embodiment employs a metal-based particle of a relatively large size that would alone be less prone to generate dipole-type localized plasmon for a visible light region, the layer has at least a specific number of such metal-based particles of a large size (which are each required to have a prescribed shape) spaced as prescribed to be closely disposed so that a significantly large number of surface free electrons that the large-sized metal-based particles include therein can be effectively excited as plasmon to achieve significantly intense plasmon resonance and plasmon resonance having effect over a significantly extended range.

Further, the inorganic layer light-emitting device of the present embodiment has a metal-based particle assembly layer configured such that at least a specific number of metal-based particles of a relatively large size having a specific shape are space in two dimensions, as prescribed, it can thereby have an advantageous effect, as follows.

(3) The metal-based particle assembly layer according to the present embodiment can present in an absorption spectrum for a visible light region a plasmon peak whose maximum wavelength presents a unique shift depending on its metal-based particles' average particle diameter and average interparticle distance, and thus allows light emission of a specific (or desired) wavelength range to be particularly enhanced. More specifically, when the metal-based particles have a fixed average interparticle distance while having increased average particle diameters, a plasmon peak at a longest side in wavelength for the visible light region has a maximum wavelength shifting toward a shorter side in wavelength (or blue-shifted). Similarly, when the large-size metal-based particles have a fixed average particle diameter while having decreased average interparticle distances (i.e., when the particles are disposed more closely), a plasmon peak at a longest side in wavelength for the visible light region has a maximum wavelength shifting toward a shorter side in wavelength. This unique phenomenon is contradictory to the Mie-scattering theory generally accepted regarding plasmon materials (according to this theory, larger particle diameters result in a plasmon peak having a maximum wavelength shifting toward a longer side in wavelength (or red-shifted)).

It is believed that the unique blue shift as described above is also attributed to the fact that the metal-based particle assembly layer is structured with large-size metal-based particles spaced as prescribed to be closely disposed, followed by the metal-based particles having their localized plasmons interacting with each other. The metal-based particle assembly layer according to the present embodiment (when it is layered on a glass substrate) can present in an absorption spectrum for a visible light region, as measured through absorptiometry, a maximum wavelength of a peak plasmon at a longest side in wavelength, and the maximum wavelength can be in a wavelength range of for example from 350 to 550 nm, depending on the metal-based particles' shape and interparticle distance. Furthermore, the metal-based particle assembly layer according to the present embodiment can typically cause a blue shift of approximately from 30 to 500 nm (e.g., 30 to 250 nm) as compared with that having metal-based particles with a sufficiently large interparticle distance (for example of 1 μm).

A metal-based particle assembly layer having a maximum wavelength of a plasmon peak blue-shifted as described above, for example, a metal-based particle assembly layer having a plasmon peak in a blue wavelength range or a range close there to is significantly useful in enhancing emission of an inorganic layer light-emitting device emitting light in a blue wavelength range or a range close there to for which there is a strong demand for enhancement of luminous efficiency.

Next will be described a specific configuration of the metal-based particle assembly layer according to the present embodiment.

Metal-based particles that compose the metal-based particle assembly layer are not specifically restricted as long as made of a material having a plasmon peak in an ultraviolet to visible light region in absorption spectrum measurement through absorptiometry in the form of nanoparticles or an assembly of such particles, and the material can include, for example, noble metals such as gold, silver, copper, platinum and palladium; metals such as aluminum and tantalum; alloys containing these noble metals or these metals; and metal compounds including these noble metals or these metals (such as metal oxides, and metal salts). Inter alia, noble metals such as gold, silver, copper, platinum and palladium are preferable, and silver is more preferable as it is inexpensive and provides small absorption (or has a small imaginary part of a dielectric function in visible light wavelengths).

The metal-based particles have an average particle diameter within a range of from 200 to 1600 nm, and to effectively obtain the effects of items (1) to (3) it falls within a range preferably of from 200 to 1200 nm, more preferably from 250 to 500 nm, still more preferably from 300 to 500 nm. It should be noted here that a metal-based particle of a large size having an average diameter for example of 500 nm is alone not observed to show substantially effective enhancement via localized plasmon. In contrast, the metal-based particle assembly layer according to the present embodiment has at least a prescribed number of (30) such large-size metal-based particles spaced as prescribed to be closely disposed, thereby achieving significantly intense plasmon resonance and plasmon resonance having an effect over a significantly extended range, and furthermore, the effect of item (3).

The average particle diameter of the metal-based particle, as referred to herein, is obtained as follows: a metal-based particle assembly layer having metal-based particles disposed in two dimensions is observed with an SEM from directly above to obtain an SEM image thereof, and therein ten particles are selected at random and in each particle's image 5 tangential diametrical lines are drawn at random (note that the straight lines serving as the tangential diametrical lines can pass through only inside the image of the particle and one of the lines is a straight line passing through only inside the particle and drawable to be the longest) and their average value serves as the particle's diameter and the 10 selected particles' respective such particle diameters are averaged to obtain the average particle diameter of the metal-based particle. The tangential diametrical line is defined as a perpendicular line connecting a spacing between two parallel lines sandwiching the particle's contour (in a projected image) in contact therewith (see the Nikkan Kogyo Shimbun, Ltd., "Particle Measurement Technique", 1994, page 5).

The metal-based particle has an average height within a range of from 55 to 500 nm, and to effectively obtain the effects of items (1) to (3) it falls within a range of preferably from 55 to 300 nm, more preferably from 70 to 150 nm. The average height of the metal-based particle is obtained as follows: the metal-based particle assembly layer (or film) is observed with an AFM to obtain an AFM image thereof and therein 10 particles are selected at random and measured in height and their measurements are averaged to obtain the average height.

The metal-based particle has an aspect ratio within a range of from 1 to 8 and to effectively obtain the effects of items (1) to (3) it falls within a range preferably of from 2 to 8, more preferably from 2.5 to 8. The aspect ratio of the metal-based particle is defined as a ratio of the above average particle diameter to the above average height (i.e., average particle diameter/average height). While the metal-based particle may be spherical, preferably it is oblate having an aspect ratio exceeding 1.

While the metal-based particle preferably has a smoothly curved surface in view of exciting significantly effective plasmon and it is more preferable that the metal-based particle be oblate having a smoothly curved surface, the metal-based particle may have a surface with small recesses and projections (or roughness) to some extent and in that sense the metal-based particle may be indefinite in shape.

Preferably, the metal-based particles have variation therebetween in size as minimal as possible in view of uniformity in intensity of plasmon resonance within a plane of the metal-based particle assembly layer. Even if there is a small variation in particle diameter, it is not preferable that large-size particles have an increased distance therebetween and it is preferable that particles of small size be introduced between the large-size particles to help the large-size particles to exhibit their interaction.

The metal-based particle assembly layer according to the present embodiment has adjacent metal-based particles disposed to have an average distance therebetween (average interparticle distance) within a range of from 1 to 150 nm. Such closely disposed metal-based particles can realize significantly intense plasmon resonance and plasmon resonance having an effect over a significantly extended range, and furthermore, the effect of item (3). The average interparticle distance is preferably within a range of from 1 to 100 nm, more preferably from 1 to 50 nm, still more preferably from 1 to 20 nm to effectively obtain the effects of items (1) to (3). An average interparticle distance smaller than 1 nm results in occurrence of electron transfer between the particles attributed to the Dexter mechanism, which disadvantageously deactivates localized plasmon.

The average interparticle distance, as referred to herein, is obtained as follows. A metal-based particle assembly layer having metal-based particles disposed in two dimensions is observed with an SEM from directly above to obtain an SEM image thereof, and therein 30 particles are selected at random and for each selected particle an interparticle distance to an adjacent particle is obtained and the 30 particles' such interparticle distances are averaged to obtain an average interparticle distance. In obtaining an interparticle distance to an adjacent particle, a distance to any adjacent particle (as obtained between their surfaces) is measured, and such measurements are averaged to obtain the interparticle distance.

The metal-based particle assembly layer includes 30 or more metal-based particles, preferably 50 or more metal-based particles. The 30 or more metal-based particles assembled together have their localized plasmons interacting with each other and thus exhibit significantly intense plasmon resonance and plasmon resonance having an effect over a significantly extended range.

In light of a typical device area of the inorganic layer light-emitting device, the metal-based particle assembly can include 300 or more metal-based particles, and furthermore, 17500 or more metal-based particles, for example.

The metal-based particle assembly layer includes metal-based particles having a number density preferably of 7 particles/$\mu m^2$ or larger, more preferably 15 particles/$\mu m^2$ or larger.

The metal-based particle assembly layer preferably has metal-based particles insulated from each other, that is, the layer is non-conductive between adjacent metal-based particles (or the metal-based particle assembly layer is non-conductive). If some or all of the metal-based particles can pass/receive electrons to/from each other, the plasmon peak loses sharpness and thus resembles an absorption spectrum of bulk metal, and high plasmon resonance is not obtained, either. Accordingly, it is preferable that the metal-based particles be surely separated and have no conductive substance interposed therebetween.

The present embodiment provides an inorganic layer light-emitting device including a metal-based particle assembly layer showing in an absorption spectrum for a visible light region a maximum wavelength of a peak at a longest side in wavelength, and the maximum wavelength shifts toward a shorter side in wavelength in a range of from 30 to 500 nm as compared with that of the reference metal-based particle assembly (X) (or having the feature indicated above at item [ii]). The inorganic layer light-emitting device of the present embodiment including a metal-based particle assembly layer having such a feature is significantly advantageous as follows.

(I) The metal-based particle assembly layer according to the present embodiment shows in an absorption spectrum for the visible light region a maximum wavelength of a plasmon peak at a longest side in wavelength, and the maximum wavelength presents in a unique wavelength range, thereby allowing light emission of a specific (or desired) wavelength range to be particularly enhanced. Specifically, when the metal-based particle assembly layer according to the present embodiment is subjected to absorption spectrum measurement, it presents the plasmon peak with a maximum wavelength shifted to a shorter side (or blue-shifted) in wavelength in a range of from 30 to 500 nm (e.g., from 30 to 250 nm) as compared with a maximum wavelength of reference metal-based particle assembly (X) described later, and typically the plasmon peak has the maximum wavelength within a range of from 350 to 550 nm.

It is believed that the blue shift as described above is attributed to the fact that the metal-based particle assembly layer is structured with at least a specific number of large-size metal-based particles each having a specific shape separated in two dimensions, followed by the metal-based particles having their localized plasmons interacting with each other.

The metal-based particle assembly layer having a maximum wavelength of a plasmon peak blue-shifted as described above, for example, a metal-based particle assembly layer having a plasmon peak in a blue wavelength range or a range close thereto is significantly useful in enhancing emission of an inorganic layer light-emitting device emitting light in a blue wavelength range or a range close thereto for which there is a strong demand for enhancement of luminous efficiency.

When a metal-based particle assembly and reference metal-based particle assembly (X) are observed to compare the maximum wavelengths of their peaks at a longest side in wavelength and the absorbances at the maximum wavelengths, a microscope ("OPTIPHOT-88" produced by Nikon) and a spectrophotometer ("MCPD-3000" produced by Otsuka Electronics Co., Ltd.) are used to perform absorption spectrum measurement in a narrowed field of view.

Reference metal-based particle assembly (X) is a metal-based particle assembly in which metal-based particles A that have a particle diameter and a height equal to the average particle diameter and the average height of a metal-based particle assembly layer subject to absorption spectrum measurement and are identical in material to the metal-based particles of the metal-based particle assembly layer are disposed such that each distance between adjacent metal-based particles may be in a range of from 1 to 2 µm, and reference metal-based particle assembly (X) has a size allowing reference metal-based particle assembly (X) layered on a glass substrate to undergo absorption spectrum measurement via a microscope, as described above.

The wave pattern of reference metal-based particle assembly (X)'s absorption spectrum is also theoretically calculatable in the 3D-FDTD method using the particle diameter and height of metal-based particle A, the dielectric function of a material of metal-based particle A, the dielectric function of a medium (e.g., air) surrounding metal-based particle A, and the dielectric function of the substrate (e.g., a glass substrate).

Furthermore, as the inorganic layer light-emitting device of the present embodiment has a metal-based particle assembly layer structured with at least a specific number of metal-based particles of a relatively large size having a specific shape separated in two dimensions, (II) the metal-based particle assembly layer can exhibit significantly intense plasmon resonance and thus allows a stronger emission enhancement effect than a conventional plasmonic material, and hence drastically increased luminous efficiency (which is similar to effect (1) of the first embodiment) and (III) the metal-based particle assembly layer can present plasmon resonance having an effect over a significantly extended range (or a plasmonic enhancement effect covering the range) and thus allows a stronger emission enhancement effect than a conventional plasmonic material, and can similarly contribute to drastically increased luminous efficiency, which is similar to effect (2) of the first embodiment, and the like. When the metal-based particle assembly layer according to the present embodiment that is layered on a glass substrate is subjected to absorption spectrum measurement, it can present for the visible light region a maximum wavelength of a plasmon peak at a longest side in wavelength, and an absorbance at the maximum wavelength can be 1 or larger, further 1.5 or larger, and still further approximately 2.

Next will be described a specific configuration of the metal-based particle assembly layer according to the present embodiment. The metal-based particle assembly layer according to the present embodiment can have a specific configuration (for the material, average particle diameter, average height, aspect ratio, average interparticle distance, and count of the metal-based particles, the metal-based particle assembly layer's non-conductance, and the like) basically similar to that of the metal-based particle assembly layer according to the first embodiment. Average particle diameter, average height, aspect ratio, and average interparticle distance are defined as in the first embodiment.

The metal-based particles have an average particle diameter within a range of from 200 to 1600 nm, and to effectively obtain the effects of items (I) to (III) it falls within a range preferably of from 200 to 1200 nm, more preferably from 250 to 500 nm, still more preferably from 300 to 500 nm. The metal-based particle assembly layer according to the present embodiment is an assembly of at least a specific number of (30) large-size metal-based particles disposed in two dimensions and thus can realize significantly intense plasmon resonance and plasmon resonance having an effect over a significantly extended range. Furthermore, to also present the feature of item [ii] (i.e., a plasmon peak shifted to a shorter side in wavelength), it is essential that the metal-based particle has a large size with an average particle diameter of 200 nm or larger, preferably 250 nm or larger.

The metal-based particle assembly layer according to the present embodiment shows for a visible light region a maximum wavelength of a plasmon peak at a longest side in wavelength, and the maximum wavelength depends on the metal-based particles' average particle diameter. More specifically, when the metal-based particles have an average particle diameter exceeding a certain value, the plasmon peak has the maximum wavelength shifting toward a shorter side in wavelength (or blue-shifted).

The metal-based particles have an average height within a range of from 55 to 500 nm, and to effectively obtain the effects of items (I) to (III) it falls within a range preferably of from 55 to 300 nm, more preferably from 70 to 150 nm. The metal-based particle has an aspect ratio within a range of from 1 to 8 and to effectively obtain the effects of items (I) to (III) it falls within a range preferably of from 2 to 8, more preferably from 2.5 to 8. While the metal-based particle may be spherical, preferably it is oblate having an aspect ratio exceeding 1.

While the metal-based particle preferably has a smoothly curved surface in view of exciting significantly effective plasmon and in particular it is more preferable that the metal-based particle be oblate having a smoothly curved surface, the metal-based particle may have a surface with small recesses and projections (or roughness) to some extent and in that sense the metal-based particle may be indefinite in shape. Preferably, the metal-based particles have variation therebetween in size as minimal as possible in view of uniformity in intensity of plasmon resonance within a plane of the metal-based particle assembly layer. Note, however, that, as has been set forth above, even if there is a small variation in particle diameter, it is not preferable that large-size particles have an increased distance therebetween, but it is preferable that particles of small size be introduced between the large-size particles to help the large-size particles to exhibit their interaction.

Preferably, the metal-based particle assembly layer according to the present embodiment has adjacent metal-based particles disposed to have an average distance therebetween (or an average interparticle distance) within a range of from 1 to 150 nm. More preferably, it is within a range of from 1 to 100 nm, still more preferably from 1 to 50 nm, particularly more preferably from 1 to 20 nm. Such closely disposed metal-based particles present the metal-based particles' localized plasmons interacting with each other effectively and thus facilitate presenting the effects of items (I) to (III). As a maximum wavelength of the plasmon peak depends on the metal-based particles' average interparticle distance, the average interparticle distance can be adjusted to control to what extent a plasmon peak at a longest side in wavelength should be blue-shifted, and the plasmon peak's maximum wavelength. An average interparticle distance smaller than 1 nm results in occurrence of electron transfer between the particles attributed to the Dexter mechanism, which disadvantageously deactivates localized plasmon.

Another means other than the above means to present the feature of item [ii] (i.e., a plasmon peak shifted to a shorter side in wavelength) can for example be introducing between the metal-based particles a dielectric substance having a dielectric constant different from that of air (which is preferably a non-conductive substance, as will be described later).

The metal-based particle assembly layer includes 30 or more metal-based particles, preferably 50 or more metal-based particles. 30 or more metal-based particles assembled together present the metal-based particles' localized plasmons interacting with each other effectively and thus allow the feature of item [ii] and the effects of items (I) to (III) to be presented.

In light of a typical device area of the inorganic layer light-emitting device, the metal-based particle assembly can include 300 or more metal-based particles, and furthermore, 17500 or more metal-based particles, for example.

The metal-based particle assembly layer includes metal-based particles having a number density preferably of 7 particles/$\mu m^2$ or larger, more preferably 15 particles/$\mu m^2$ or larger.

The metal-based particle assembly layer according to the present embodiment, as well as that of the first embodiment, preferably has metal-based particles insulated from each other, that is, the layer is non-conductive between adjacent metal-based particles (or the metal-based particle assembly layer is non-conductive).

Third Embodiment

The present embodiment provides an inorganic layer light-emitting device including a metal-based particle assembly layer showing in an absorption spectrum for a visible light region a maximum wavelength of a peak at a longest side in wavelength, and an absorbance at the maximum wavelength is higher as compared with that of reference metal-based particle assembly (Y) (or having the feature indicated above at item [iii]), on the premise that the numbers of metal-based particles are the same. The inorganic layer light-emitting device of the present embodiment including a metal-based particle assembly layer having such a feature is significantly advantageous in the following points.

(A) The metal-based particle assembly layer according to the present embodiment shows for a visible light region a maximum wavelength of a peak at a longest side in wavelength, or a plasmon peak, and an absorbance at the maximum wavelength is higher as compared with that of reference metal-based particle assembly (Y) that can be regarded as an assembly of metal-based particles simply assembled together without any interparticle interaction. Accordingly, the metal-based particle assembly layer exhibits significantly intense plasmon resonance, and thus allows a stronger emission enhancement effect than a conventional plasmonic material, and hence drastically increased luminous efficiency. It is believed that such intense plasmon resonance is exhibited as the metal-based particles present localized plasmons interacting with each other.

As has been described above, the plasmon peak's absorbance value in magnitude at the maximum wavelength thereof can be used to easily evaluate the plasmonic material's plasmon resonance in intensity, and when the metal-based particle assembly layer according to the present embodiment that is layered on a glass substrate is subjected to absorption spectrum measurement, it can present for a visible light region a maximum wavelength of a plasmon peak at a longest side in wavelength, and an absorbance at the maximum wavelength can be 1 or larger, further 1.5 or larger, and still further approximately 2.

As has been previously described, when a metal-based particle assembly and reference metal-based particle assembly (Y) are observed to compare the maximum wavelengths of their peaks at a longest side in wavelength and the absorbances at the maximum wavelengths, a microscope ("OP-TIPHOT-88" produced by Nikon) and a spectrophotometer ("MCPD-3000" produced by Otsuka Electronics Co., Ltd.) are used to perform absorption spectrum measurement in a narrowed field of view.

Reference metal-based particle assembly (Y) is a metal-based particle assembly in which metal-based particles B that have a particle diameter and a height equal to the average particle diameter and average height of a metal-based particle assembly layer subject to absorption spectrum measurement and are identical in material to the metal-based particles of the metal-based particle assembly layer are disposed such that each distance between adjacent metal-based particles may be in a range of from 1 to 2 $\mu m$, and reference metal-based particle assembly (Y) has a size allowing reference metal-based particle assembly (Y) layered on a glass substrate to undergo absorption spectrum measurement via a microscope, as described above.

When the metal-based particle assembly layer subject to absorption spectrum measurement and reference metal-based particle assembly (Y) are compared in their absorbances at the maximum wavelengths of their peaks at a longest side in wavelength, an absorption spectrum of reference metal-based particle assembly (Y) as converted to have the same number of metal-based particles is obtained and an absorbance at a maximum wavelength of a peak in that absorption spectrum, which peak is present at a longest side in wavelength, is used as a target for comparison, as will be described hereinafter. Specifically, an absorption spectrum of the metal-based particle assembly and that of reference metal-based particle assembly (Y) are obtained and the absorbances at the maximum wavelengths of the peaks in the absorption spectra, which peaks are present at a longest side in wavelength, respectively, are divided by their respective coverages (i.e., the coverages of their respective substrates' surfaces by the metal-based particles), and the obtained values are compared.

Furthermore, as the inorganic layer light-emitting device of the present embodiment has a metal-based particle assembly layer structured with at least a specific number of metal-based particles of a relatively large size having a specific shape separated in two dimensions, it can have such effects as follows: (B) the metal-based particle assembly layer presents plasmon resonance that can have an effect over a significantly extended range (or a plasmonic enhancement effect that can cover the range) and the layer thus allows a stronger emission enhancement effect than a conventional plasmonic material, and hence drastically increased luminous efficiency (as well as effect (2) of the first embodiment); (C) the metal-based particle assembly layer can exhibit a plasmon peak having a maximum wavelength uniquely shifted and thus allows emission of a specific (or desired) wavelength range to be particularly enhanced (as well as effect (3) of the first embodiment); and the like.

The metal-based particle assembly layer of the present embodiment (when it is layered on a glass substrate) can present in an absorption spectrum for a visible light region, as measured through absorptiometry, a maximum wavelength of a plasmon peak at a longest side in wavelength, and the maximum wavelength can be in a range of for example from 350 to 550 nm, depending on the metal-based particles' shape and interparticle distance. Furthermore, the metal-based particle assembly layer of the present embodiment can typically cause a blue shift of approximately from 30 to 500 nm (e.g., from 30 to 250 nm) as compared with that having metal-based particles with a sufficiently large interparticle distance (for example of 1 μm).

Next will be described a specific configuration of the metal-based particle assembly layer according to the present embodiment. The metal-based particle assembly layer according to the present embodiment can have a specific configuration (for the material, average particle diameter, average height, aspect ratio, average interparticle distance, and count of the metal-based particles, the metal-based particle assembly layer's non-conductance, and the like) basically similar to that of the metal-based particle assembly layer according to the first embodiment. Average particle diameter, average height, aspect ratio, and average interparticle distance are defined as in the first embodiment.

The metal-based particles have an average particle diameter within a range of from 200 to 1600 nm, and to effectively obtain the feature of item [iii] (i.e., to have an absorbance at a maximum wavelength of a plasmon peak at a longest side in wavelength, which absorbance is larger than that of reference metal-based particle assembly (Y)), and furthermore the effects of items (A) to (C), it falls within a range preferably of from 200 to 1200 nm, more preferably from 250 to 500 nm, still more preferably from 300 to 500 nm. Thus it is important to use relatively large-size metal-based particles, and at least a specific number of (30) such large-size metal-based particles disposed in two dimensions and thus assembled together can achieve significantly intense plasmon resonance and furthermore, plasmon resonance having an effect over a significantly extended range and a plasmon peak shifted to a shorter side in wavelength.

The metal-based particles have an average height within a range of from 55 to 500 nm, and to effectively obtain the feature of item [iii] and furthermore, the effects of items (A) to (C), it falls within a range preferably of from 55 to 300 nm, more preferably from 70 to 150 nm. The metal-based particle has an aspect ratio within a range of from 1 to 8 and to effectively obtain the feature of item [iii] and furthermore, the effects of items (A) to (C) it falls within a range preferably of from 2 to 8, more preferably from 2.5 to 8. While the metal-based particle may be spherical, preferably it is oblate having an aspect ratio exceeding 1.

While the metal-based particle preferably has a smoothly curved surface in view of exciting significantly effective plasmon and in particular it is more preferable that the metal-based particle be oblate having a smoothly curved surface, the metal-based particle may have a surface with small recesses and projections (or roughness) to some extent and in that sense the metal-based particle may be indefinite in shape.

Preferably, the metal-based particle assembly layer is configured of as uniform metal-based particles as possible in size and shape (average particle diameter, average height, and aspect ratio), as such metal-based particles can effectively achieve the feature of item [iii]. More specifically, uniforming the metal-based particles in size and shape provides a sharp plasmon peak, followed by that an absorbance of a plasmon peak at a longest side in wavelength facilitates being higher than that of reference metal-based particle assembly (Y). Metal-based particles less varying in size and shape are also advantageous in view of uniformity in intensity of plasmon resonance within a plane of the metal-based particle assembly layer. Note, however, that, as has been set forth above, even if there is a small variation in particle diameter, it is not preferable that large-size particles have an increased distance therebetween, but it is preferable that particles of small size be introduced between the large-size particles to help the large-size particles to exhibit their interaction.

Preferably, the metal-based particle assembly layer according to the present embodiment has adjacent metal-based particles disposed to have an average distance therebetween (or an average interparticle distance) within a range of from 1 to 150 nm. More preferably, it is within a range of from 1 to 100 nm, still more preferably from 1 to 50 nm, particularly more preferably from 1 to 20 nm. Such closely disposed metal-based particles present the metal-based particles' localized plasmons interacting with each other effectively and thus allow the feature of item [iii] and furthermore, the effects of items (A) to (C) to be effectively presented. An average interparticle distance smaller than 1 nm results in occurrence of electron transfer between the particles attributed to the Dexter mechanism, which disadvantageously deactivates localized plasmon.

The metal-based particle assembly layer includes 30 or more metal-based particles, preferably 50 or more metal-based particles. 30 or more metal-based particles assembled together present the metal-based particles' localized plasmons interacting with each other effectively and thus allow the feature of item [iii] and furthermore, the effects of items (A) to (C) to be effectively presented.

In light of a typical device area of the inorganic layer light-emitting device, the metal-based particle assembly can include 300 or more metal-based particles, and furthermore, 17500 or more metal-based particles, and yet furthermore, 1260000 or more metal-based particles, for example.

The metal-based particle assembly layer includes metal-based particles having a number density preferably of 7 particles/μm$^2$ or larger, more preferably 15 particles/μm$^2$ or larger.

The metal-based particle assembly layer according to the present embodiment, as well as that of the first embodiment, preferably has metal-based particles insulated from each other, that is, the layer is non-conductive between adjacent metal-based particles (or the layer is non-conductive).

Thus the metal-based particle assembly layer according to the present embodiment having the feature of item [iii] can be obtained by controlling its constituent metal-based particles in metal type, size, shape, average interparticle distance, and the like.

The metal-based particle assembly layer that the inorganic layer light-emitting device of the present invention includes preferably has the feature of any one of items [i]-[iii], more preferably any two or more thereof, and still more preferably all thereof <Method for Producing Metal-Based Particle Assembly Layer>

A metal-based particle assembly layer according to the present invention including the metal-based particle assembly layers according to the first to third embodiments can be produced in such a method as follows:

(1) a bottom-up method to grow metal-based particles from minute seeds on a substrate;

(2) a method in which a metal-based particle that has a prescribed shape is covered with a protection layer made of an amphiphilic material and having a prescribed thickness, and the resultant is then subjected to Langmuir Blodgett (LB) deposition to be formed in a film on a substrate; and (3) other methods, such as a method of post-treating a thin film obtained by vapor deposition, sputtering or the like;

resist-processing; etching processing; a casting method using a liquid having metal-based particles dispersed therein, and the like.

It is important that method (1) includes the step of growing a metal-based particle at a significantly low speed on a substrate adjusted to have a prescribed temperature (hereinafter also referred to as the particle growth step). A production method including the particle growth step can provide a satisfactorily controlled layer (or thin film) of a metal-based particle assembly having 30 or more metal-based particles mutually separated and thus disposed in two dimensions, and having a shape within a prescribed range (an average particle diameter of 200 to 1600 nm, an average height of 55 to 500 nm, and an aspect ratio of 1 to 8) and still preferably an average interparticle distance within a prescribed range (from 1 to 150 nm).

In the particle growth step, the metal-based particle is grown on the substrate preferably at an average height growth rate smaller than 1 nm/minute, more preferably 0.5 nm/minute or smaller. The average height growth rate as referred to herein can also be referred to as an average deposition rate or the metal-based particle's average thickness growth rate, and is defined by the following expression:

metal-based particle's average height/metal-based particle growth time(supplying time of a metal-based material).

The "metal-based particle's average height" is defined as set forth above.

In the particle growth step, the substrate is set in temperature preferably within a range of from 100 to 450° C., more preferably from 200 to 450° C., still more preferably from 250 to 350° C., and particularly still more preferably 300° C. or thereabout (300° C.±approximately 10° C.).

When the production method includes the particle growth step to grow metal-based particles at an average height growth rate smaller than 1 nm/minute on a substrate adjusted in temperature within the range of from 100 to 450° C., the particles are initially grown such that a supplied metal-based material forms a plurality of island structures, and as the metal-based material is further supplied the island structures are further grown and thus merged with neighboring island structures, and consequently, metal-based particles having a relatively large average particle diameter are closely disposed while metal-based particles each are completely separated from each other to form a metal-based particle assembly layer. Thus, a metal-based particle assembly layer can be produced that is formed of metal-based particles controlled to have a shape within a prescribed range (in average particle diameter, average height, and aspect ratio) and still preferably an average interparticle distance within a prescribed range.

Furthermore, the average height growth rate, the substrate's temperature and/or the metal-based particle growth time (the supplying time of the metal-based material) can be adjusted to also control within a prescribed range the average particle diameter, the average height, the aspect ratio, and/or the average interparticle distance of the metal-based particles grown on the substrate.

Furthermore, the production method including the particle growth step also allows the particle growth step to be performed such that conditions other than the substrate's temperature and the average height growth rate are selected relatively freely, and the method thus also advantageously allows a metal-based particle assembly layer of a desired size to be efficiently formed on a substrate of a desired size.

If the average height growth rate is 1 nm/minute or larger, or the substrate has a temperature lower than 100° C. or higher than 450° C., then before the island structure is grown to be large the island structure forms a continuum with a neighboring island structure and a metal-based assembly formed of metal-based particles mutually completely separated and having a large particle diameter cannot be obtained or a metal-based assembly formed of metal-based particles having a desired shape cannot be obtained (for example, it would depart in average height, average interparticle distance, and aspect ratio from a desired range).

While the metal-based particles are grown under a pressure (in an apparatus's chamber), which may be any pressure that allows the particles to be grown, it is normally lower than atmospheric pressure. While the pressure's lower limit is not limited to a specific value, it is preferably 6 Pa or larger, more preferably 10 Pa or larger, still more preferably 30 Pa or larger, as such pressure helps to adjust the average height growth rate within the range indicated above.

The metal-based particles can specifically be grown on a substrate in any method allowing the particles to be grown at an average height growth rate smaller than 1 nm/minute, and the method can include sputtering, and vapor deposition such as vacuum deposition. Preferable sputtering is direct current (DC) sputtering as it allows a metal-based particle assembly layer to be grown relatively conveniently and also facilitates maintaining the average height growth rate smaller than 1 nm/minute. The sputtering may be done in any system and it can for example be an ion gun, or be direct current argon ion sputtering to expose a target to argon ions generated by a plasma discharge and accelerated in an electric field. The sputtering is done with a current value, a voltage value, a substrate-to-target distance and other conditions adjusted as appropriate to grow particles at the average height growth rate smaller than 1 nm/minute.

Note that to obtain a satisfactorily controlled metal-based particle assembly layer formed of metal-based particles having a shape within a prescribed range (in average particle diameter, average height, and aspect ratio) and still preferably an average interparticle distance within a prescribed range, it is preferable that the particle growth step be performed at the average height growth rate smaller than 1 nm/minute and in addition thereto an average particle diameter growth rate smaller than 5 nm, and when the average height growth rate is smaller than 1 nm/minute, the average particle diameter growth rate is normally smaller than 5 nm. The average particle diameter growth rate is more preferably 1 nm/minute or smaller. The average particle diameter growth rate is defined by the following expression:

metal-based particle's average particle diameter/ metal-based particle growth time(supplying time of a metal-based material).

The "metal-based particle's average particle diameter" is defined as set forth above.

The metal-based particle growth time (the supplying time of a metal-based material) in the particle growth step is a period of time that at least allows metal-based particles carried on a substrate to attain a shape within a prescribed range and still preferably an average interparticle distance within a prescribed range and that is smaller than a period of time allowing the particles to depart from the shape within the prescribed range and the average interparticle distance within the prescribed range. For example, even though particle growth is performed at an average height growth rate and substrate temperature within the above prescribed ranges, an significantly long period of time for growth results in a metal-based material carried in an excessively large amount and accordingly it will not form an assembly of mutually separated metal-based particles and instead form a continuous film or be metal-based particles excessively large in average particle size or average height.

Accordingly it is necessary to grow metal-based particles for an appropriately set period of time (or to stop the particle growth step at an appropriate time), and such time can be set based for example on a relationship between an average height growth rate and a substrate's temperature and a shape and average interparticle distance of metal-based particles of a metal-based particle assembly obtained, as previously obtained through an experiment. Alternatively a time elapsing before a thin film of a metal-based material grown on a substrate exhibits conduction (that is, a time allowing the thin film to be a continuous film rather than a metal-based particle assembly film) may previously be obtained through an experiment and the particle growth step may be stopped before that time is reached.

The metal-based particles are grown on a substrate preferably having as smooth a surface as possible and, inter alia, more preferably a surface that is smooth at the atomic level. When the substrate has a smoother surface, thermal energy received from the substrate helps a growing metal-based particle to merge with a surrounding, adjacent metal-based particle and thus grow, and thus there is a tendency to facilitate providing a film formed of metal-based particles of a larger size.

The substrate on which the metal-based particles are grown can exactly be used as a substrate of the inorganic layer light-emitting device. That is, a substrate having a metal-based particle assembly layer layered or carried thereon, as produced in the above method, (i.e., a metal-based particle assembly layer-layered substrate) can be used as a constituent member of the inorganic layer light-emitting device.

<Configuration of Inorganic Layer Light-Emitting Device>

The inorganic layer light-emitting device of the present invention at least includes: a light-emitting layer including an emission body made of an inorganic material; and a metal-based particle assembly layer described above. The inorganic layer light-emitting device of the present invention includes the metal-based particle assembly layer described above, thus it can exhibit a high luminous efficiency.

FIG. 1 is a cross section view of an example of an inorganic layer light-emitting device of the present invention. The inorganic layer light-emitting device shown in FIG. 1 includes: a light-emitting layer 50 including an emission body made of an inorganic material; and a metal-based particle assembly layer that is a layer (or film) consisting of a particle assembly disposed in the inorganic layer light-emitting device and formed of 30 or more metal-based particles 20 mutually separated and disposed in two dimensions. As shown in FIG. 1, the inorganic layer light-emitting device of the present invention, as well as a typical inorganic layer light-emitting device, can be such constituent layers as described above that are layered on a substrate 10.

In the inorganic layer light-emitting device shown in FIG. 1, light-emitting layer 50 emits light by irradiating light having a prescribed wavelength capable of exciting light-emitting layer 50. Further, other than the excitation of the light-emitting layer by the method of irradiating light, as well as the inorganic LED devices shown in FIGS. 2 and 3, the emission of light can be performed also by providing electrode layers (function layers formed as needed) on upper and lower sides of the light-emitting layer and allowing emission of light with electric driving, more specifically, by hole injection from a positive electrode and a negative electrode, and electron injection and accordingly generating exciter on the light-emitting layer.

Figure 2:
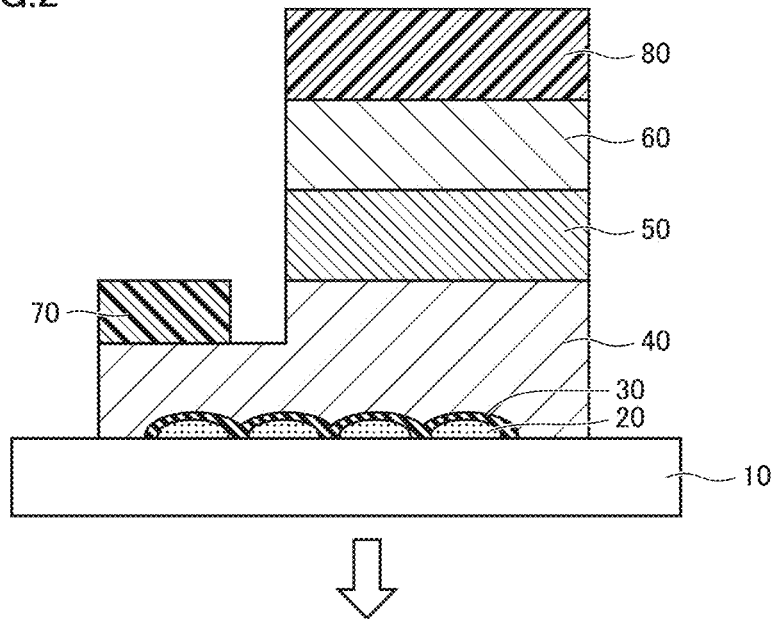
FIG. 2 is a schematic cross section view of an example for an inorganic LED device of the present invention.

FIG. 2 is a schematic cross section view of an example for an inorganic LED device of the present invention, and shows a structure example of an inorganic LED device with electric driving. The inorganic LED device shown in FIG. 2 is a blue LED configured to extract light from a side of substrate 10 (the arrow in the drawing represents a light-extracting direction; an outer surface of substrate 10 is a light extraction face), and includes substrate 10; a metal-based particle assembly layer that is a layer which is layered on a surface of substrate 10 on a side of the light-emitting layer and formed of 30 or more metal-based particles 20 mutually separated and disposed in two dimensions; an insulating layer 30 layered on the metal-based particle assembly layer; an n-type clad layer 40 layered on insulating layer 30 and made of n-GaN; a light-emitting layer 50 layered on n-type clad layer 40 and made of InGaN/GaN; a p-type clad layer 60 layered on light-emitting layer 50 and made of p-GaN; a first electrode 70 (anode) disposed on an exposed surface of n-type clad layer 40 formed by etching or the like; and a second electrode 80 (cathode) layered on p-type clad layer 60. The metal-based particle assembly layer is layered directly on (or carried directly on) substrate 10.

Figure 3:
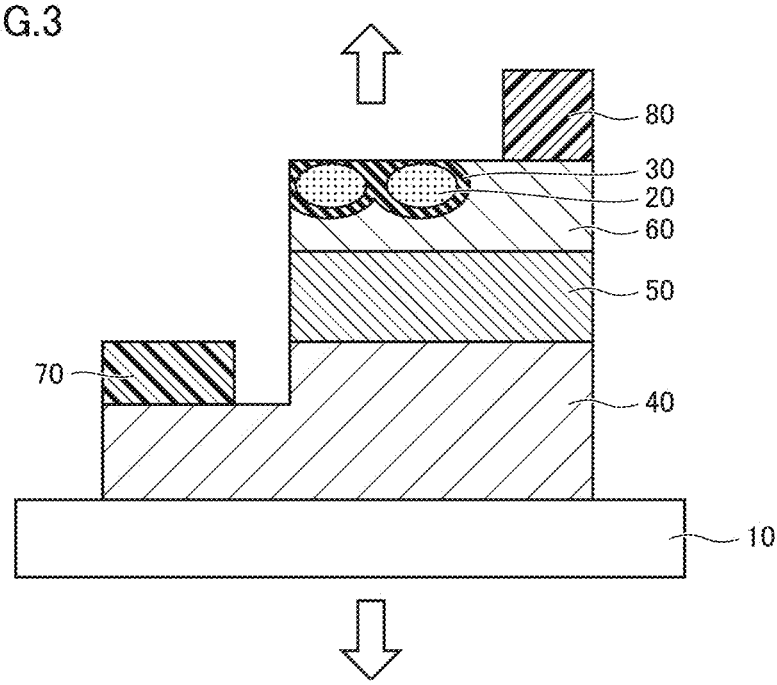
FIG. 3 is a schematic cross section view of another example for an inorganic LED device of the present invention.

Further, FIG. 3 is a schematic cross section view of another example for an inorganic LED device of the present invention, and shows a structure example of an inorganic LED device with electric driving, similar to FIG. 2. The inorganic LED device shown in FIG. 3 is a blue LED configured to be able to extract light from a front surface and a back surface of the device (the arrow in the drawing represents a light-extracting direction) and shows an example in which the metal-based particle assembly layer is disposed along an outer surface (a surface on an opposite side of light-emitting layer 50) of p-type clad layer 60 as a light extraction face.

Not limited to the examples shown in FIGS. 1 to 3, while the metal-based particle assembly layer can be disposed at any position in the inorganic layer light-emitting device, the layer is preferably disposed closer to a light extraction face than the light-emitting layer 50, more preferably in a vicinity of the light extraction face. As has been set forth above, the present invention allows a metal-based particle assembly layer to present plasmon resonance to have an effect over a significantly extended range, and accordingly allows the metal-based particle assembly layer to be disposed at such a position in a vicinity of the light extraction face apart from light-emitting layer 50 while ensuring a high emission enhancement effect. The metal-based particle assembly layer disposed closer to the light extraction face allows more improved light extraction efficiency and hence more improved luminous efficiency. Disposing the metal-based particle assembly layer in the inorganic layer light-emitting device is advantageous in shortening the fluorescence durability of the light-emitting layer receiving the plasmon enhance, and shortening the time during which the emission body is in an excited state, thereby suppressing the deterioration of the emission body.

In the inorganic layer light-emitting devices shown in FIGS. 1 and 2, the metal-based particle assembly layer can be layered directly on (or carried directly on) substrate 10, and the metal-based particle assembly layer and substrate 10 thus stacked in layers can preferably implemented by the metal-based particle assembly layer-layered substrate that can be produced in the above described method. In the inorganic LED device shown in FIG. 3, the metal-based particle assembly layer can be layered, for example, by allowing the layer to grow in the method described above on insulating layer 30 formed on p-type clad layer 60.

While substrate 10 may be formed of any material including a material conventionally employed in a substrate of an inorganic layer light-emitting device, it is preferable that substrate 10 be a non-conductive substrate to ensure that the metal-based particle assembly layer is non-conductive especially when the metal-based particle assembly layer is layered directly on substrate 10. The non-conductive substrate can be formed of glass, sapphire, a variety of inorganic insulating materials ($SiO_2$, $ZrO_2$, mica, and the like), and a variety of plastic materials. Particularly, when a light extraction face is provided on substrate 10, substrate 10 is preferably transparent, more preferably optically transparent.

As shown in FIGS. 1 to 3, the inorganic layer light-emitting device of the present invention preferably further includes an insulating layer 30 interposed between light-emitting layer 50 and metal-based particle assembly layer, more specifically, covering respective surfaces of metal-based particles 20 constituting the metal-based particle assembly layer. Such insulating layer 30 can ensure that metal-based particle assembly layer is non-conductive (or the metal-based particles are non-conductive therebetween) as described above, and insulating layer 30 also allows the metal-based particle assembly layer and an adjacent layer to be electrically insulated from each other. While the inorganic layer light-emitting device has each constituent layer with a current passing therethrough, the metal-based particle assembly layer with a current passing therethrough may result in failing to obtain a sufficient emission enhancement effect via plasmon resonance. Providing insulating layer 30 that caps the metal-based particle assembly layer allows a metal-based particle assembly layer and an adjacent layer to be electrically insulated from each other and can thus prevent a current from being injected into the metal-based particles that compose the metal-based particle assembly layer.

Insulating layer 30 is formed of any material that is not specifically restricted as long as having satisfactory insulation, and it can be formed for example of spin on glass (SOG; containing organic siloxane material for example) and in addition thereto $SiO_2$, $Si_3N_4$ or the like. While insulating layer 30 is of any thickness that is not restricted as long as ensuring desired insulation, it is better that insulating layer 30 is smaller in thickness in a range ensuring desired insulation as it is preferable that light-emitting layer 50 and the metal-based particle assembly layer be closer in distance, as will be described later.

N-type clad layer 40, light-emitting layer 50, p-type clad layer 60, first electrode 70, and second electrode 80 are not limited those described as examples but may be configured with a material which has been conventionally known in the field, and the thicknesses of those may have a thickness which an inorganic layer light-emitting device typically has. The emission body made of an inorganic material constituting light-emitting layer 50 and its thickness are selected in accordance with a desired emission wavelength. Examples of the emission body may include, in an inorganic LED device, GaAsP, GaP, InGaN, InAlGaN, ZnCdSe, GaAlAs, InGaAlP, and the like, and in an inorganic EL device, ZnS:Mn, a rare earth added alkaline earth thioaluminate-based fluorescent body disclosed in Japanese Patent Laying-Open No. 8-134440, and the like. N-type clad layer 40, light-emitting layer 50, and p-type clad layer 60 can be formed by metalorganic chemical vapor deposition (MOCVD method), and first electrode 70 and second electrode 80 can be formed by a vapor deposition method.

While light-emitting layer 50 may have a thickness of typically at least 1 nm, and the thickness may be at least 10 nm, about 100 nm, still further the thickness larger than that in the case of a multi-quantum well structure, the present invention includes a metal-based particle assembly layer presenting intense plasmon resonance and plasmon resonance having an effect over a significantly extended range (or a plasmonic enhancement effect covering the range), and thus allows light-emitting layer 50 as a whole to provide enhancement and hence improved luminous efficiency of the inorganic layer light-emitting device, even when light-emitting layer 50 has a large thickness.

The inorganic layer light-emitting device of the present invention is not limited to a distance between light-emitting layer 50 and the metal-based particle assembly layer (a distance from the light-emitting layer 50 side surface of the metal-based particle assembly layer to light-emitting layer 50) and thus can achieve enhancement via plasmon with the metal-based particle assembly layer disposed at a position for example 10 nm, further several tens nm (e.g., over 20 nm, 30 nm, or 40 nm), still further several hundreds nm away from light-emitting layer 50 as described above.

For example, even if the inorganic layer light-emitting device of the present has light-emitting layer 50 and the metal-based particle assembly layer with a distance of 20 nm or larger therebetween, it nonetheless allows the emission body constituting light-emitting layer 50 to have a photoluminescence quantum yield (i.e., the number of discharged photons divided by that of absorbed photons) of 1.5 times or larger, furthermore, 3 times or larger than that of a reference inorganic layer light-emitting device that does not have the metal-based particle assembly layer.

Note that there is a tendency that, for its nature, the plasmonic emission enhancement effect decreases as the distance between light-emitting layer 50 and the metal-based particle assembly layer increases, so it is preferable that the distance be smaller. Light-emitting layer 50 and the metal-based particle assembly layer have a distance therebetween preferably of 100 nm or smaller, more preferably 20 nm or smaller, and still more preferably 10 nm or smaller.

The inorganic layer light-emitting device of the present invention can further include another layer such as a buffer layer, a current diffusion layer, and the like, not illustrated in the drawing, which the conventional inorganic layer light-emitting device may have.

Preferably the metal-based particle assembly layer has a plasmon peak with a maximum wavelength matching or close to the emission wavelength of light-emitting layer 50. This allows plasmon resonance to contribute to a more effectively increased emission enhancement effect by the plasmon resonance. The maximum wavelength of the plasmon peak of the metal-based particle assembly layer is controllable by adjusting the layer's constituent metal-based particles in metal type, average particle diameter, average height, aspect ratio, and/or average interparticle distance.

EXAMPLES

Hereinafter, examples will be described to more specifically describe the present invention, although the present invention is not limited thereto.

Producing Metal-Based Particle Assembly Layer-Layered Substrate

Production Example 1

Figure 4:
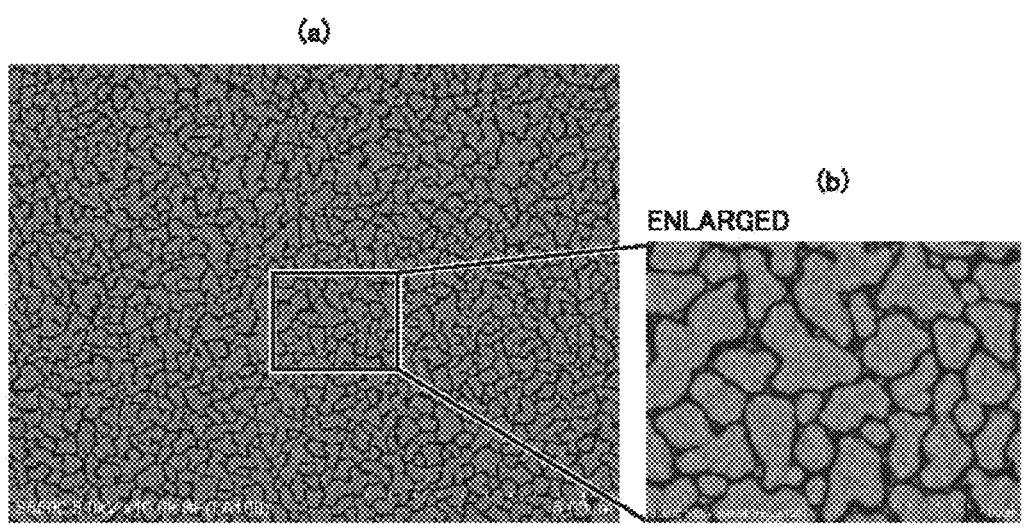
FIG. 4 is SEM images (as scaled 10000 times and 50000 times) of a metal-based particle assembly layer in a metal-based particle assembly layer-layered substrate obtained in Production Example 1, as observed from directly above.
Figure 5:
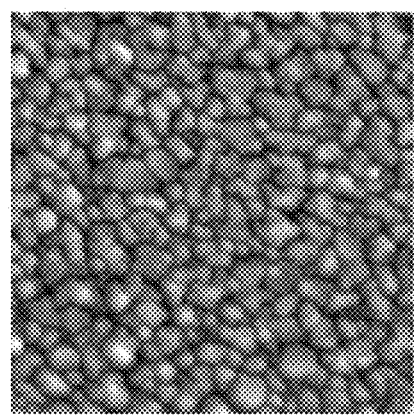
FIG. 5 is an AFM image of the metal-based particle assembly layer in the metal-based particle assembly layer-layered substrate obtained in Production Example 1.

A direct-current magnetron sputtering apparatus was used to grow silver particles significantly slowly on a soda glass substrate to form a thin film of a metal-based particle assembly on the entire surface of the substrate to produce a metal-based particle assembly layer-layered substrate under the following conditions.

gas used: argon;
pressure in chamber (sputtering-gas pressure): 10 Pa;
substrate-to-target distance: 100 mm;
sputtering power: 4 W;
average particle diameter growth rate (average particle diameter/sputtering time): 0.9 nm/minute;
average height growth rate (=average deposition rate=average height/sputtering time): 0.25 nm/minute;
substrate's temperature: 300° C.; and
substrate's size and shape: a square with each side having a length of 5 cm FIG. 4 is SEM images of a metal-based particle assembly layer in the obtained metal-based particle assembly layer-layered substrate, as observed from directly above. FIG. 4(a) is an image enlarged as scaled 10000 times and FIG. 4 (b) is an image enlarged as scaled 50000 times. FIG. 5 is an AFM image of the metal-based particle assembly layer in the metal-based particle assembly layer-layered substrate obtained. The AFM image was obtained via "VN-8010" produced by KEYENCE CORPORATION (this is also applied hereinafter). FIG. 5 shows an image having a size of 5 µm×5 µm.

A calculation with reference to the FIG. 4 SEM images indicates that the present Production Example provided a metal-based particle assembly configured silver particles having an average particle diameter of 335 nm and an average interparticle distance of 16.7 mm, as based on the definition indicated above. Furthermore, from the FIG. 5 AFM image, an average height of 96.2 nm was obtained. From these values the silver particle's aspect ratio (average particle diameter/average height) was calculated to be 3.48 and it can also be found from the obtained images that the silver particles have an oblate shape. Furthermore, it can be seen from the SEM images that the metal-based particle assembly layer of this Production Example has approximately $6.25 \times 10^{10}$ silver particles (approximately 25 particles/µm$^2$).

Furthermore, the obtained metal-based particle assembly layer-layered substrate had the metal-based particle assembly layer connected at a surface to a tester [multimeter "E2378A" produced by Hewlett Packard Co.] to confirm conduction, and it has been found to be non-conductive.

Production Example 2

An aqueous silver nanoparticle dispersion (produced by Mitsubishi Paper Mills, Ltd., silver nanoparticle concentration: 25% by weight) was diluted with pure water to have a silver nanoparticle concentration of 2% by weight. Then to the aqueous silver nanoparticle dispersion 1% by volume of a surfactant was added and sufficiently agitate and there after to the obtained aqueous silver nanoprticle dispersion 80% by volume of acetone was added and sufficiently agitated at ordinary temperature to prepare a silver nanoparticle coating liquid.

Then, the silver nanoparticle coating liquid was applied with spin-coating at 1000 rpm on a 1 mm thick soda glass substrate having a surface wiped with acetone and thereafter the substrate was left as it is in the atmosphere for 1 minute and subsequently annealed in an electric furnace of 550° C. for 40 seconds. A silver nanoparticle layer was thus formed, and on the nanoparticles layer the silver nanoparticle coating liquid was again applied with spin-coating at 1000 rpm and thereafter left as it is in the atmosphere for 1 minute and subsequently annealed in an electric furnace of 550° C. for 40 seconds to obtain a metal-based particle assembly layer-layered substrate.

Figure 6:
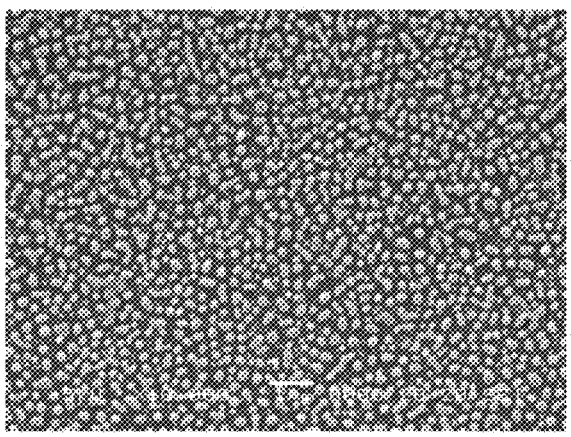
FIG. 6 is SEM images (as scaled 10000 times and 50000 times) of a metal-based particle assembly layer in a metal-based particle assembly layer-layered substrate obtained in Production Example 2, as observed from directly above.
Figure 6:
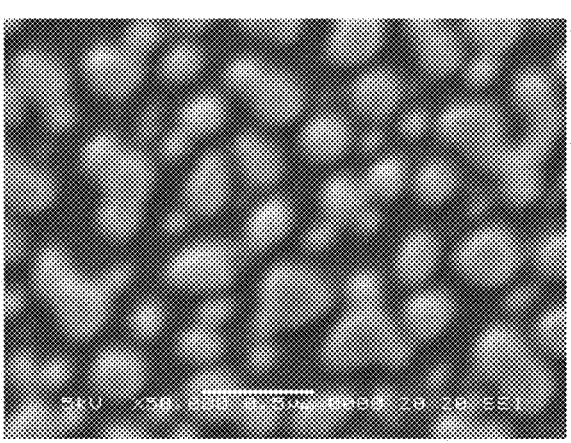
Figure 7:
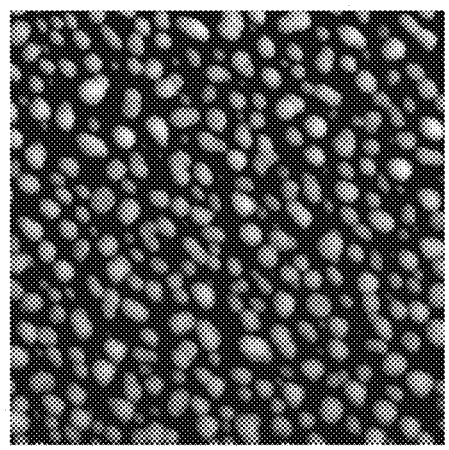
FIG. 7 is an AFM image of the metal-based particle assembly layer in the metal-based particle assembly layer-layered substrate obtained in Production Example 2.

FIG. 6 is SEM images of a metal-based particle assembly layer in the obtained metal-based particle assembly layer-layered substrate, as observed from directly above. FIG. 6(a) is an image enlarged as scaled 10000 times and FIG. 6(b) is an image enlarged as scaled 50000 times. FIG. 7 is an AFM image of the metal-based particle assembly layer in the metal-based particle assembly layer-layered substrate obtained. FIG. 7 shows an image having a size of 5 µm×5 µm.

A calculation with reference to FIG. 6 SEM images indicates that the present Production Example provided a metal-based particle assembly layer configured of silver particles having an average particle diameter of 293 nm and an average interparticle distance of 107.8 nm, as based on the definition indicated above. Furthermore, from the FIG. 7 AFM image, an average height of 93.0 was obtained. From these values the silver particle's aspect ratio (average particle diameter/average height) was calculated to be 3.15 and it can also be found from the obtained images that the silver particles have an oblate shape. Furthermore, it can be seen from the SEM images that the metal-based particle assembly layer of this Production Example has approximately $3.13 \times 10^{10}$ silver particles (approximately 12.5 particles/µm$^2$).

Furthermore, the obtained metal-based particle assembly layer-layered substrate had the metal-based particle assembly layer connected at a surface to a tester [multimeter "E2378A" produced by Hewlett Packard Co.] to confirm conduction, and it has been found to be non-conductive.

Comparative Production Examples 1 and 2

The direct-current magnetron sputtering was done with a varied sputtering time to produce metal-based particle assembly layer-layered substrate of Comparative Production Examples 1 and 2. The metal-based particle assembly layer-layered substrate of Comparative Production Example 1 had metal-based particles having approximately the same shape, aspect ratio, and average interparticle distance as Production Example 1 except that the metal-based particles had an average height of approximately 10 nm, and the metal-based particle assembly layer-layered substrate of Comparative Production Example 2 had metal-based particles having approximately the same shape, aspect ratio and average interparticle distance as Production Example 1 except that the metal-based particles had an average height of approximately 30 nm.

Comparative Production Example 3

An aqueous silver nanoparticle dispersion (produced by Mitsubishi Paper Mills, Ltd., silver nanoparticle concentration: 25% by weight) was diluted with pure water to have a silver nanoparticle concentration of 6% by weight. Then to the aqueous silver nanoparticle dispersion 1% by volume of a surfactant was added and sufficiently agitated and thereafter to the obtained aqueous silver nanoparticle dispersion 80% by volume of acetone was added and sufficiently agitated at ordinary temperature to prepare a silver nanoparticle coating liquid.

Then, the silver nanoparticle coating liquid was applied with spin-coating at 1500 rpm on a 1 mm thick soda glass substrate having a square shape with 5 cm sides and having a surface wiped with acetone and thereafter the substrate was left as it is in the atmosphere for 1 minute and subsequently annealed in an electric furnace of 550° C. for 5 minutes to obtain a metal-based particle assembly layer-layered substrate.

Figure 8:
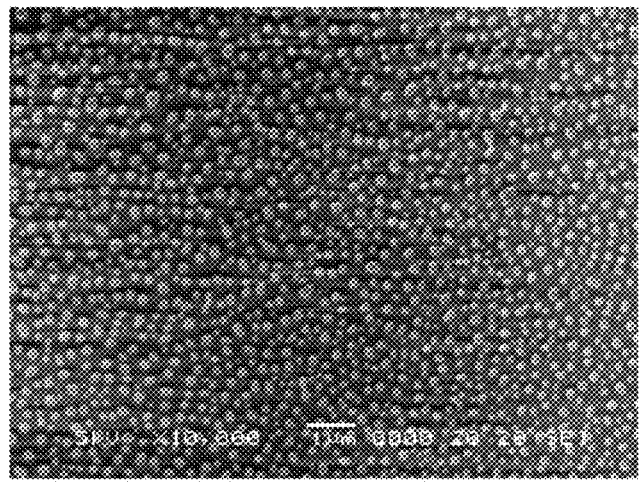
FIG. 8 is an SEM image (as scaled 10000 times) of a metal-based particle assembly layer in a metal-based particle assembly layer-layered substrate obtained in Comparative Production Example 3, as observed from directly above.
Figure 9:
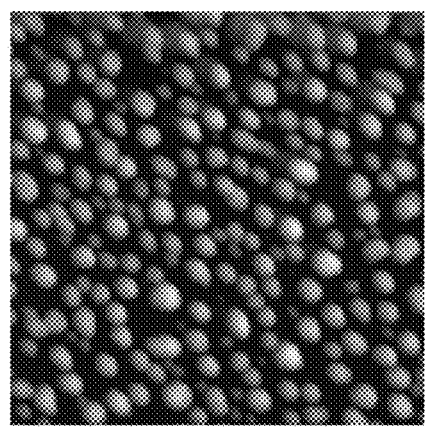
FIG. 9 is an AFM image of the metal-based particle assembly layer in the metal-based particle assembly layer-layered obtained in Comparative Production Example 3.

FIG. 8 is an SEM image of a metal-based particle assembly layer in the metal-based particle assembly layer-layered substrate obtained in this Comparative Production Example 3, as observed from directly above, and is an image enlarged as scaled 10000 times. Further, FIG. 9 is an AFM image of the metal-based particle assembly layer in the metal-based particle assembly layer-layered substrate obtained in this Comparative Production Example 3. FIG. 9 shows an image having a size of 5 μm×5 μm.

A calculation with reference to FIG. 8 SEM image indicates that the present Comparative Production Example 3 provided a metal-based particle assembly layer configured of silver particles having an average particle diameter of 278 nm and an average interparticle distance of 195.5 nm, as based on the definition indicated above. Furthermore, from the FIG. 9 AFM image, an average height of 99.5 nm was obtained. From these values the silver particle's aspect ratio (average particle diameter/average height) was calculated to be 2.79 and it can also be found from the obtained images that the silver particles have an oblate shape. Furthermore, it can be seen from the SEM image that the metal-based particle assembly layer of this Comparative Production Example 3 has approximately $2.18 \times 10^{10}$ silver particles (approximately 8.72 particles/μm$^2$).

[Measuring Absorption Spectrum of Metal-Based Particle Assembly Layer-Layered Substrate]

Figure 10:
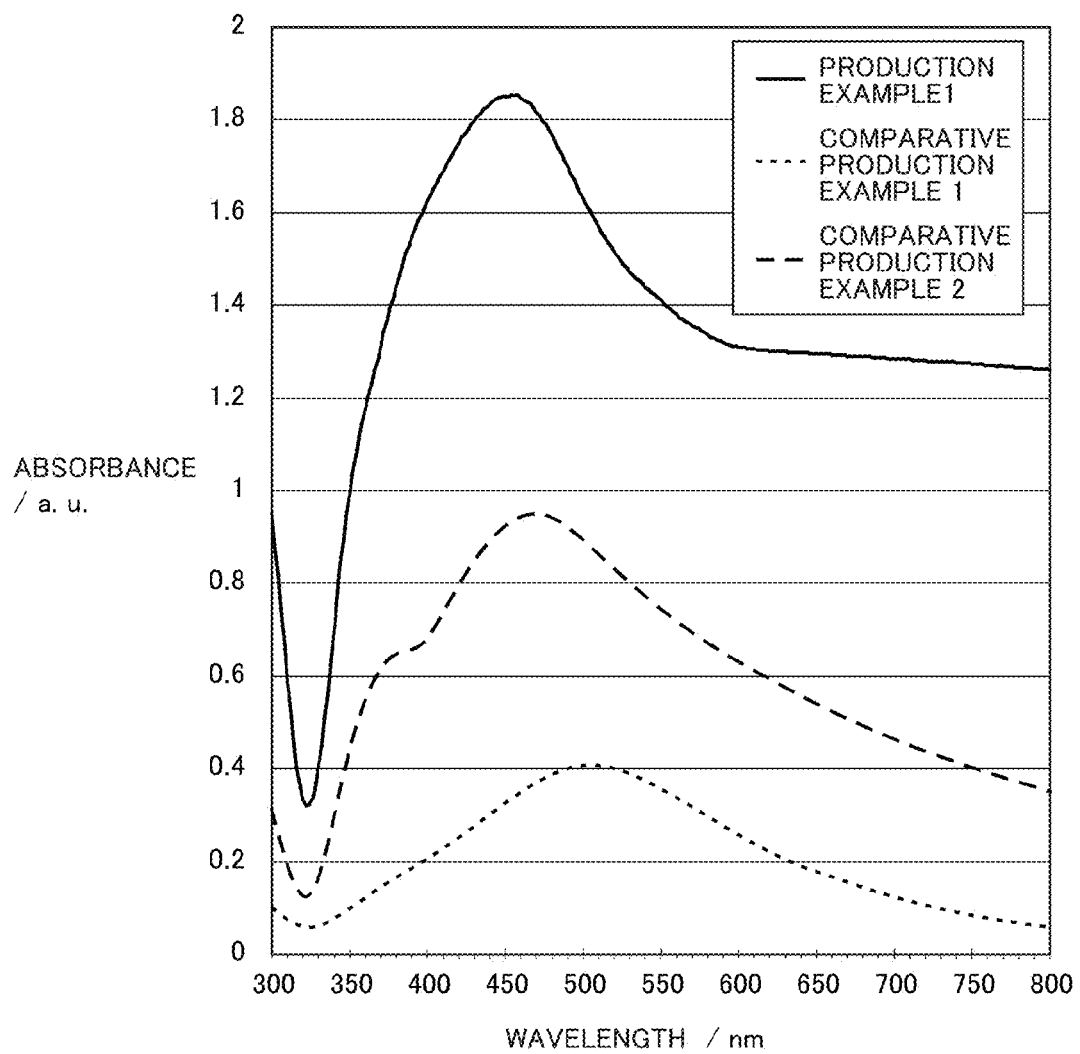
FIG. 10 is absorption spectra of the metal-based particle assembly layer-layered substrates obtained in Production Example 1 and Comparative Production Examples 1 and 2.

FIG. 10 represents absorption spectra, as measured through absorptiometry, of the metal-based particle assembly layer-layered substrate obtained in Production Example 1 and Comparative Production Examples 1 and 2. As indicated in a nonpatent document (K. Lance Kelly, et al., "The Optical Properties of Metal Nanoparticles: The Influence of Size, Shape, and Dielectric Environment", The Journal of Physical Chemistry B, 2003, 107, 668), an oblate silver particle as produced in Production Example 1 typically has a plasmon peak around 550 nm and 650 nm for average particle diameters of 200 nm and 300 nm, respectively (a silver particle alone in either cases).

In contrast, it can be seen that Production Example 1's metal-based particle assembly layer-layered substrate, with its constituent silver particles having an average particle diameter of approximately 300 nm (335 nm), nonetheless presents for a visible light region a maximum wavelength of a plasmon peak at a longest side in wavelength, and the maximum wavelength is around approximately 450 nm, or shifted to a shorter side in wavelength, as shown in FIG. 10. This phenomenon can be manifested when the silver particles are large-size particles having the above prescribed shape and also have the above prescribed interparticle distance and are disposed significantly closely, as provided in Production Example 1. Such a phenomenon would not rationally be understandable without considering that the particles that are closely adjacent allow their respective, internally caused plasmons to interact with each other.

Furthermore, the plasmon peak's maximum wavelength also depends on the metal-based particles' average particle diameter. For example, Comparative Production Examples 1 and 2 have small average particle diameters, and accordingly have a plasmon peak at a side considerably longer in wavelength than Production Example 1, with maximum wavelengths of approximately 510 nm and approximately 470 nm, respectively.

Further, Production Example 1 shows for the visible light region a maximum wavelength of a plasmon peak at a longest side in wavelength, and an absorbance at the maximum wavelength is approximately 1.9, which is significantly higher than Comparative Production Examples 1 and 2 and it can be seen therefrom that Production Example 1 provides a metal-based particle assembly layer presenting significantly intense plasmon resonance.

Figure 11:
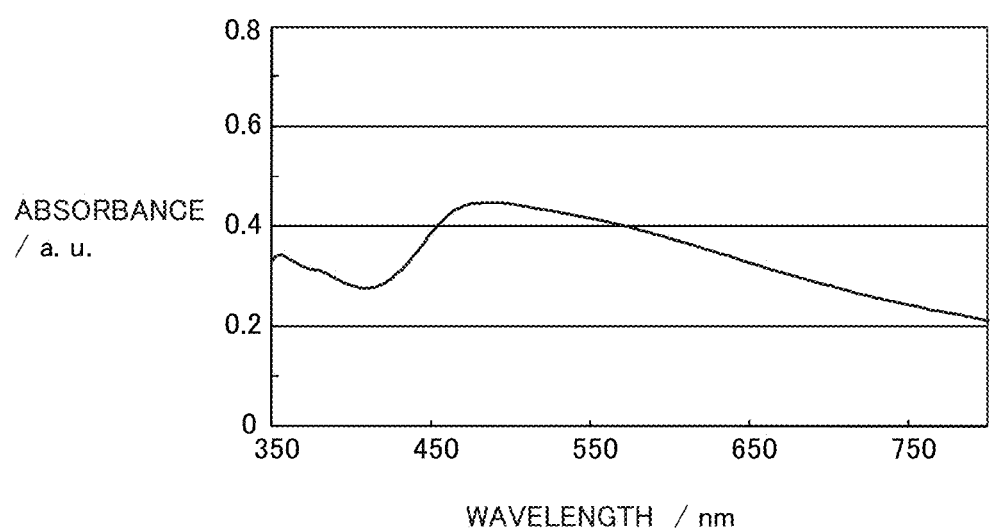
FIG. 11 is an absorption spectrum of the metal-based particle assembly layer-layered substrate obtained in Production Example 2.

FIG. 11 represents an absorption spectrum, as measured through absorptiometry, of the metal-based particle assembly layer-layered substrate obtained in Production Example 2. It present for the visible light region a maximum wavelength of a plasmon peak at a longest side in wavelength, and the maximum wavelength was 488 nm.

Note that FIGS. 10 and 11 absorption spectra are obtained as follows: a metal-based particle assembly layer-layered substrate is exposed to light of the ultraviolet to visible light region incident on a back surface thereof (i.e., a side opposite to the metal-based particle assembly layer) in a direction perpendicular to a substrate surface and intensity I of transmitted light omnidirectionally transmitted toward the metal-based particle assembly layer is measured with an integrating sphere spectrophotometer. On the other hand, a substrate which does not have a metal-based particle assembly film and has the same thickness and the same material as the substrate of said metal-based particle assembly film-layered substrate is exposed at a surface thereof to the same incident light as above in a direction perpendicular to that surface and intensity $I_0$ of transmitted light omnidirectionally transmitted through a side opposite to the incident surface is measured with the integrating sphere spectrophotometer. The axis of ordinate represents absorbance, which is represented by the following expression:

$$\text{Absorbance} = -\log_{10}(I/I_0)$$

[Producing Reference Metal-Based Particle Assembly and Measuring Absorption Spectrum]

Figure 12:
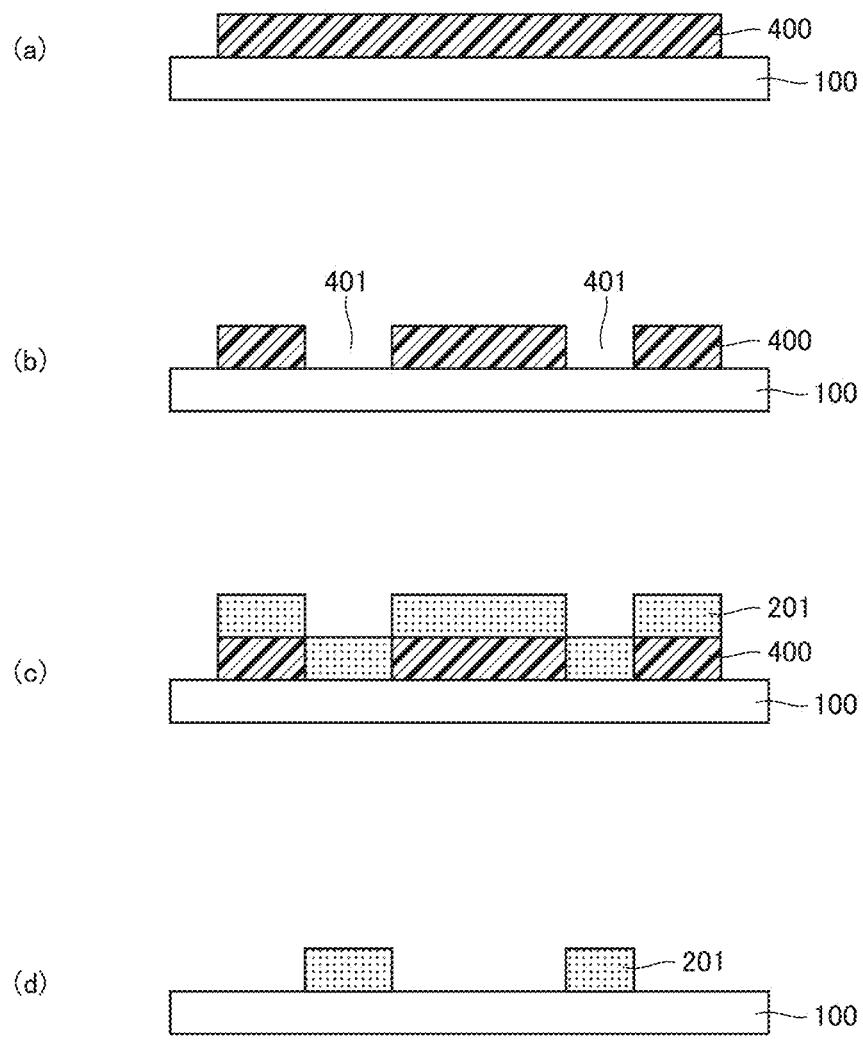
FIG. 12 is a schematic flow diagram showing a method for producing a reference metal-based particle assembly.

A method shown in FIG. 12 was used to produce a substrate having a reference metal-based particle assembly layered thereon. Initially, resist (ZEP520A produced by Nippon Zeon Co., Ltd.) was applied with spin-coating on an entire surface of a 5 cm long and 5 cm wide soda glass substrate 100 (See FIG. 12(*a*)). Resist 400 had the thickness of approximately 120 nm. Then electron beam lithography was employed to provide resist 400 with a circular opening 401 (See FIG. 12(*b*)). Circular opening 401 had a diameter of approximately 350 nm. Furthermore, adjacent circular openings 401 had a center-to-center distance of approximately 1500 nm.

Subsequently, resist 400 having circular opening 401 was subjected to vapor deposition to have a silver film 201 deposited thereon (see FIG. 12 (*c*)). Silver film 201 had the thickness of approximately 100 nm. Finally, the substrate having silver film 201 was immersed in NMP (N-methyl-2-pyrrolidone produced by Tokyo Chemical Industry Co., Ltd.), and settled in an ultrasonic device for one minute at room temperature to peel off resist 400 and silver film 201 deposited on resist 400, thereby obtaining a reference metal-based particle assembly layer-layered substrate in which only the silver film 201 (silver particles) in circular opening 401 was left and layered on soda glass substrate 100 (see FIG. 12(*d*)).

Figure 13:
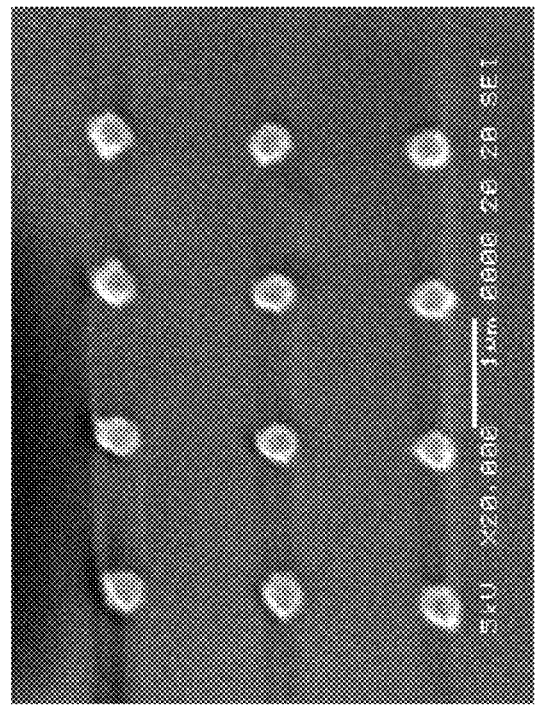
FIG. 13 is SEM images (as scaled 20000 times and 50000 times) of a reference metal-based particle assembly layer in a reference metal-based particle assembly layer-layered substrate, as observed from directly above.
Figure 13:
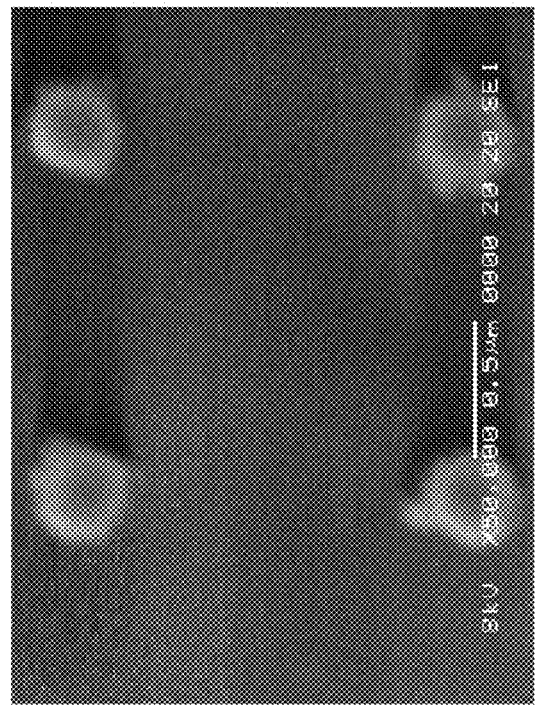

FIG. 13 is SEM images of a reference metal-based particle assembly layer in the obtained reference metal-based particle assembly layer-layered substrate, as observed from directly above. FIG. 13(*a*) is an image enlarged as scaled 20000 times and FIG. 13(*b*) is an image enlarged as scaled 50000 times. A calculation with reference to the FIG. 13 images indicates that the reference metal-based particle assembly layer was configured of silver particles having a particle diameter of 333 nm and an average interparticle distance of 1264 nm, as based on the definition indicated above. Furthermore, from a separately obtained AFM image, an average height of 105.9 nm was obtained. Furthermore, from the SEM images, it has been found that the reference metal-based particle assembly had approximately 62500 silver particles.

Figure 14:
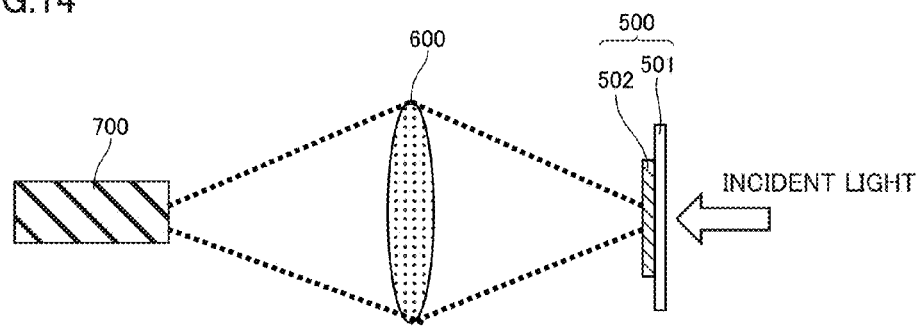
FIG. 14 illustrates an absorption spectrum measurement method using an objective lens (100 times) of a microscope.

In accordance with the above described measurement method using a microscope's objective lens (100 times), absorption spectrum measurement was performed for the metal-based particle assembly layer-layered substrate of Production Example 1. More specifically, with reference to FIG. 14, a metal-based particle assembly layer-layered substrate 500 had a substrate 501 exposed at a side thereof (a side opposite to a metal-based particle assembly layer 502) to light of a visible light region incident thereon in a direction perpendicular to a substrate surface. The transmitted light that was transmitted to a side of metal-based particle assembly layer 502 and reached an objective lens 600 of 100 times was condensed by objective lens 600 and detected via a spectrophotometer 700 to obtain an absorption spectrum.

Figure 15:
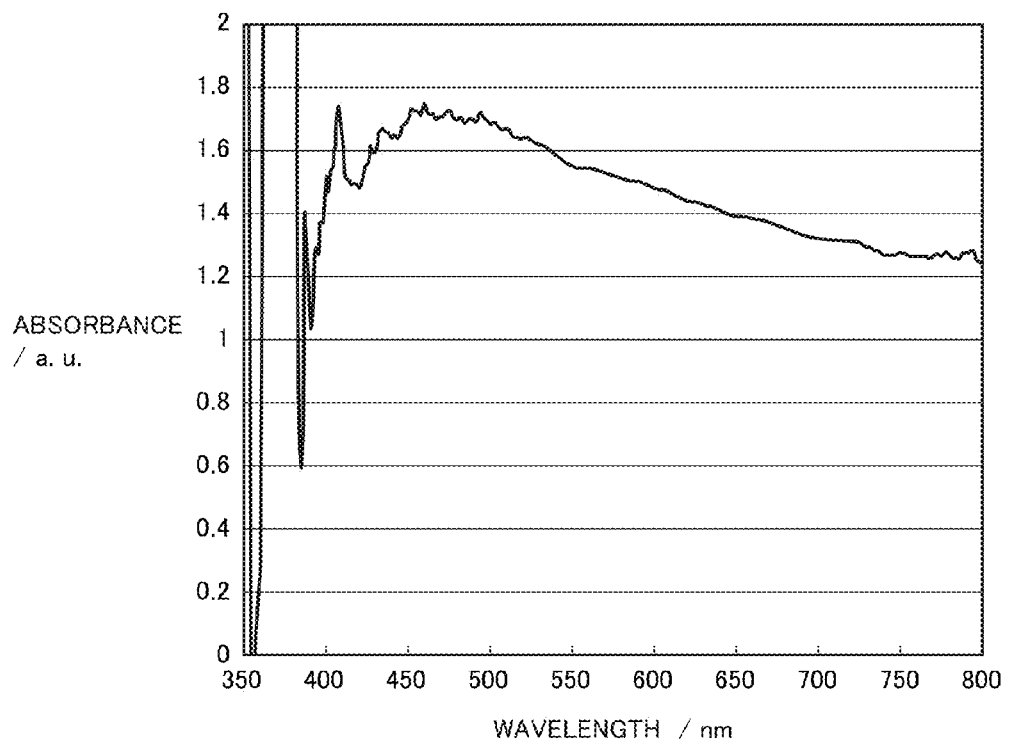
FIG. 15 is an absorption spectrum of the metal-based particle assembly layer-layered substrate obtained in Production Example 1, as measured by a method using an objective lens (100 times) of a microscope.

For spectrophotometer 700 was used "MCPD-3000", a spectrophotometer produced by Otsuka Electronics Co., Ltd. for an ultraviolet and visible region, and for objective lens 600 was used "BD Plan 100/0.80 ELWD" produced by Nikon. The result is shown in FIG. 15. A plasmon peak at a longest side in wavelength for the visible light region had a maximum wavelength similar to that shown in FIG. 10 absorption spectrum, i.e., approximately 450 nm. In contrast, when absorption spectrum measurement was performed for the reference metal-based particle assembly layer-layered substrate also in accordance with the measurement method using the microscope's objective lens, it presented for the visible light region a maximum wavelength of a peak at a longest side in wavelength, and the maximum wavelength was 654 nm. Production Example 1's metal-based particle assembly layer-layered substrate presents for the visible light region a maximum wavelength of a peak at a longest side in wavelength, and the maximum wavelength is blue-shifted by approximately 200 nm as compared with that of the reference metal-based particle assembly layer-layered substrate.

The metal-based particle assembly layer-layered substrate of Production Example 1 presented for the visible light region a maximum wavelength of a peak at a longest side in wavelength, and an absorbance at the maximum wavelength was 1.744 (see FIG. 15), whereas the reference metal-based particle assembly layer-layered substrate presented an absorbance of 0.033. As the metal-based particle assembly layer-layered substrate of Production Example 1 and the metal-based particle assembly layer-layered substrate were examined to compare the absorbances at the maximum wavelengths of their peaks at a longest side in wavelength, they were compared for the same number of metal-based particles, and to do so, an absorbance obtained from an absorption spectrum was divided by a parameter corresponding to the number of metal-based particles, i.e., a coverage of substrate's surface by the metal-based particles, to calculate absorbance/coverage. The metal-based particle assembly layer-layered substrate of Production Example 1 presented absorbance/coverage of 2.04 (coverage: 85.3%), whereas the reference metal-based particle assembly layer-layered substrate presented absorbance/coverage of 0.84 (coverage: 3.9%).

Figure 16:
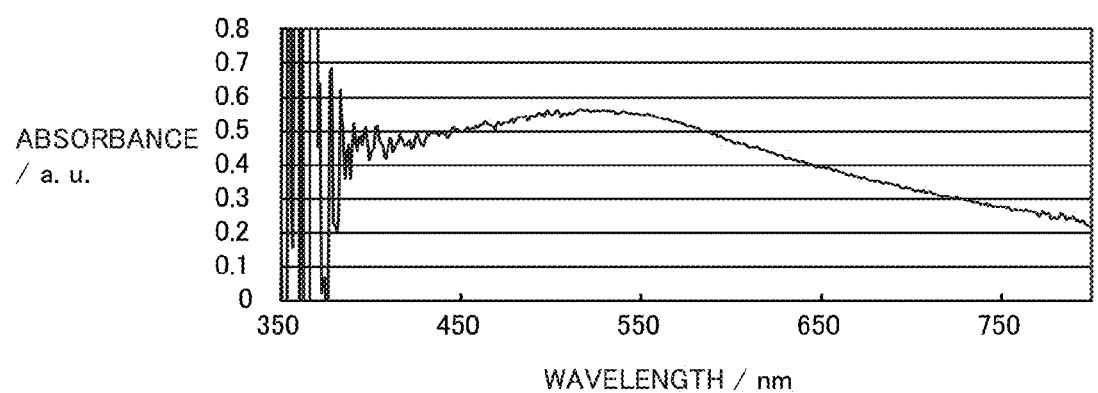
FIG. 16 is an absorption spectrum of the metal-based particle assembly layer-layered substrate obtained in Production Example 2, as measured by a method using an objective lens (100 times) of a microscope.
Figure 17:
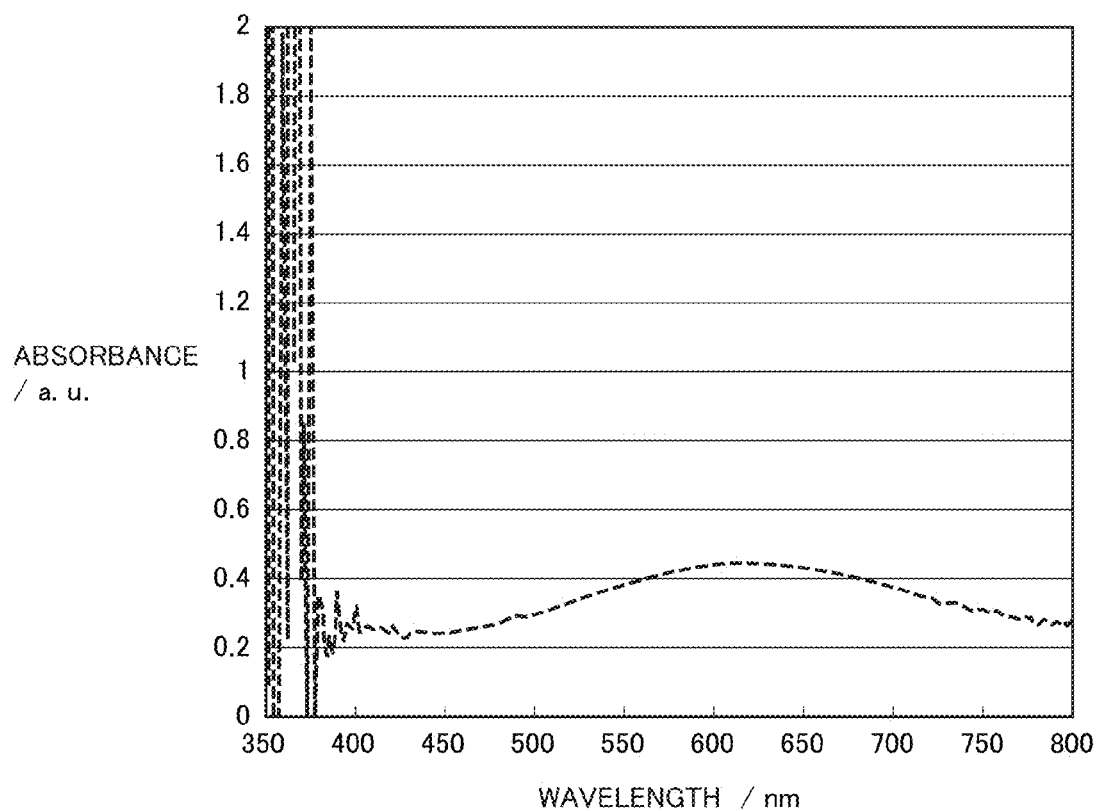
FIG. 17 is an absorption spectrum of the metal-based particle assembly layer-layered substrate obtained in Comparative Production Example 3, as measured by a method using an objective lens (100 times) of a microscope.

FIGS. 16 and 17 show absorption spectra of the metal-based particle assembly layer-layered substrates obtained in Production Example 2 and Comparative Production Example 3, as measured in a method using an objective lens (100 times) of a microscope. The metal-based particle assembly layer-layered substrate obtained in Comparative Production Example 3 presented for the visible light region a maximum wavelength of a peak at a longest side in wavelength, and the maximum wavelength was 611 nm. This maximum wavelength is substantially the same as that of the reference metal-based particle assembly film-layered substrate corresponding to the metal-based particle assembly film-layered substrate of Comparative Production Example 3, and the metal-based particle assembly film of Comparative Production Example 3 substantially does not show a blue shift. The FIG. 17 absorption spectrum provides for the visible light region a maximum wavelength of a peak at a longest side in wavelength, and an absorbance at the maximum wavelength is 0.444 and the metal-based particles cover the substrate's surface at a coverage of 53.2%, and therefrom absorbance/coverage of 0.83 is calculated. This absorbance/coverage is smaller than that of the metal-based particle assembly layer-layered substrate.

The metal-based particle assembly of Production Example 2 has metal-based particles having a larger average particle diameter than that of the metal-based particle assembly of Comparative Production Example 3, and accordingly it is rationally inferred from the Mie-scattering theory that the metal-based particle assembly of Production Example 2 presents a plasmon peak appearing at a longer side in wavelength than that of Comparative Production Example 3. In reality, however, the metal-based particle assembly of Production Example 2 has presented a plasmon peak at a shorter side in wavelength than that of Production Example 3 by as much as 100 nm or larger. This rationally indicates that the metal-based particle assembly of Production Example 2 presents a plasmon peak with a maximum wavelength shifted toward a shorter side in wavelength than the reference metal-based particle assembly in a range of 30 to 500 nm.

Producing Inorganic Layer Light-Emitting Device and Assessing Emission Enhancement Example 1

Silver particles were grown under the same condition as Production Example 1 to form on a 0.5 mm thick soda glass substrate the metal-based particle assembly layer similar to that of Production Example 1. The metal-based particle assembly layer had metal-based particles having the same shape and average interparticle distance as Production Example 1 except that the meta-based particles had an average height of 57.3 nm. After forming the metal-based particle assembly layer, immediately a SOG solution was applied with spin-coating on the metal-based particle assembly layer to have an insulating layer having an average thickness of 10 nm layered thereon. For the SOG solution was used "OCD T-7 5500T", an organic SOG material produced by TOKYO OHKA KOGYO CO., LTD., which was then diluted with ethanol. The "average thickness" means average thickness as provided on a metal-based particle assembly layer having an irregular surface, and it was measured as thickness provided when the SOG solution was directly applied to the soda glass substrate by spin coating (this is also applied to the following reference and comparative reference examples). When the average thickness has a relatively small value, the metal-based particle assembly layer may have the insulating layer formed only in a trough and may not have its outermost surface entirely covered therewith.

Then, an inorganic light-emitting layer solution containing aqueous dispersion of a fluorescent paint "Lumilite Nano R-Y202" sold by Sinloihi Co., Ltd., pure water, and isopropyl alcohol mixed at a volume ratio of 2:2:1 was spin-coated at 1500 rpm on to an uppermost surface of the metal-based particle assembly layer having the above described insulating layer to form an inorganic light-emitting layer, so that an inorganic layer light-emitting device was obtained.

Example 2

An inorganic layer light-emitting device was produced similarly as done in Example 1 except that the insulating layer had an average thickness of 30 nm.

Example 3

An inorganic layer light-emitting device was produced similarly as done in Example 1 except that the insulating layer had an average thickness of 80 nm.

Example 4

An inorganic layer light-emitting device was produced similarly as done in Example 1 except that the insulating layer had an average thickness of 150 nm.

Comparative Example 1

Silver particles were grown under the same condition as Comparative Production Example 3 to provide on a 0.5 mm thick soda glass substrate the metal-based particle assembly layer described in Comparative Production Example 3. Thereafter immediately the same SOG solution as that used in Example 1 was spin-coated on to the metal-based particle assembly layer to have an insulating layer having an average thickness of 10 nm layered thereon. Thereafter, similarly to Example 1, an inorganic light-emitting layer was formed on an uppermost surface of the metal-based particle assembly layer having the above described insulating layer to obtain an inorganic layer light-emitting device.

Comparative Example 2

An inorganic layer light-emitting device was produced similarly as done in Comparative Example 1 except that the insulating layer had an average thickness of 30 nm.

Comparative Example 3

An inorganic layer light-emitting device was produced similarly as done in Comparative Example 1 except that the insulating layer had an average thickness of 80 nm.

Comparative Example 4

An inorganic layer light-emitting device was produced similarly as done in Comparative Example 1 except that the insulating layer had an average thickness of 150 nm.

Comparative Reference Example

The inorganic light-emitting layer solution as used in Example 1 was directly spin-coated at 1500 rpm to a 0.5 mm thick soda glass substrate to form an inorganic light-emitting layer, so that an inorganic layer light-emitting device was obtained.

Figure 18:
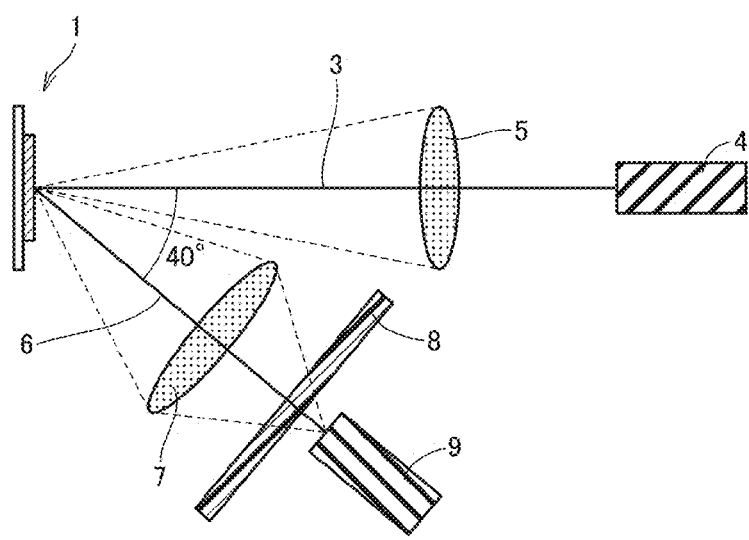
FIG. 18 schematically shows a system to measure an emission spectrum of an inorganic layer light-emitting device.

Inorganic layer light-emitting devices produced in Examples 1 to 4, Comparative Examples 1 to 4, and the Comparative Reference Example were assessed for emission enhancement in level, as follows. In other words, with reference to FIG. 18 showing a system employed to measure the inorganic layer light-emitting devices' emission spectra and FIG. 1 showing a schematic cross section view of an inorganic layer light-emitting device, an inorganic light-emitting layer 50 side of inorganic layer light-emitting device 1 was exposed to excitation light 3 from a direction perpendicular to a surface of inorganic light-emitting layer 50 to cause inorganic light-emitting device 1 to emit light. For an excitation light source 4 emitting excitation light 3 was used a UV-LED (UV-LED375-14S produced by SOUTH WALKER, excitation light wavelength: 375 nm). Radiated was excitation light 3 obtained by condensing the light emitted from excitation light source 4 through a lens 5. An emitted light 6 from inorganic layer light-emitting device 1 in a direction of 40 degrees relative to the optical axis of excitation light 3 was condensed by a lens 7 and then transmitted through a wavelength cut-off filter 8 (SCF-505-44Y produced by SIGMA KOKI Co., LTD) to cut the light of the wavelength of excitation light 3 and then detected via a spectrometer 9 (MCPD-3000 produced by Otsuka Electronics Co., Ltd.)

Figure 19:
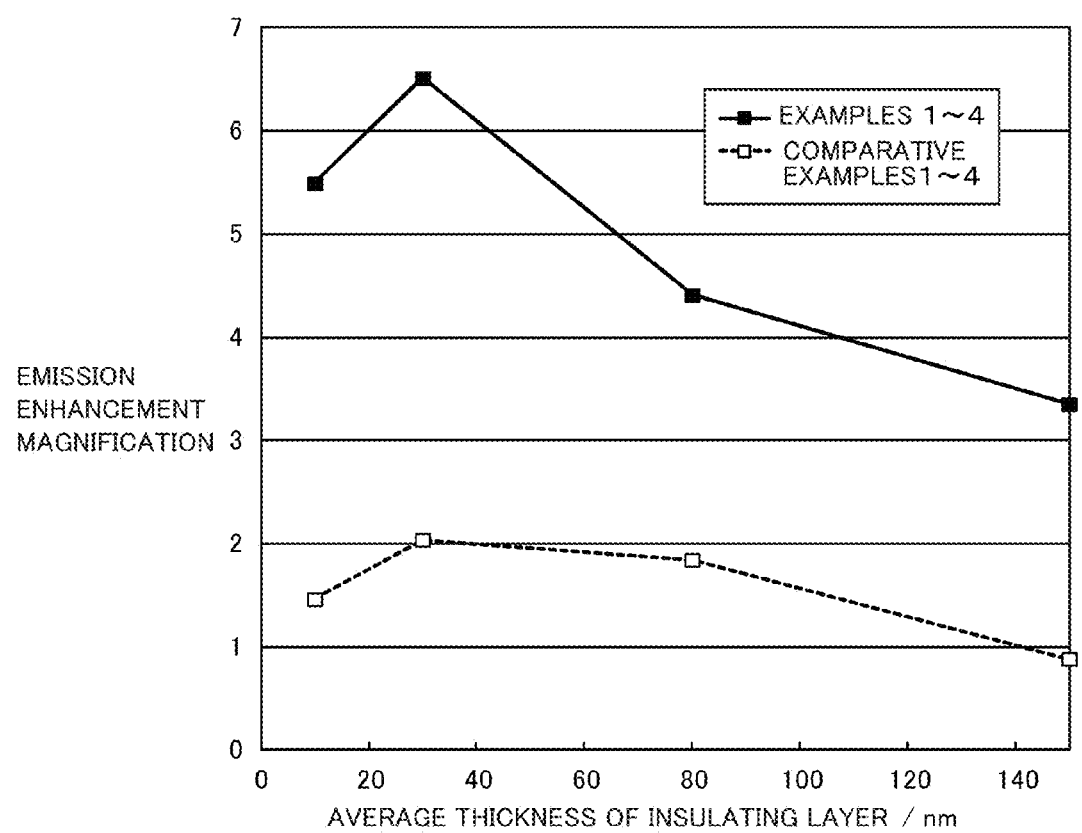
FIG. 19 is a graph comparing emission enhancement effects in the inorganic layer light-emitting devices of Examples 1 to 4 with emission enhancement effects in the inorganic layer light-emitting devices of Comparative Examples 1 to 4.

From the spectra of the emissions detected, peak values were obtained for the emission wavelength ranges. The respective peak values obtained from each emission spectrum of the inorganic layer light-emitting devices of Examples 1 to 4 and Comparative Examples 1 to 4 were divided by the peak values obtained from an emission spectrum of the inorganic layer light-emitting device of Comparative Reference Example to obtain "emission enhancement magnification" as presented in the graph of FIG. 19 along the axis of ordinate.

REFERENCE SIGNS LIST

1 inorganic light-emitting device; 3 excitation light; 4 excitation light source; 5, 7 lens; 6 emitted light from inorganic layer light-emitting device; 8 wavelength cut-off filter; 9 spectrometer; 10 substrate; 20 metal-based particle; 30 insulating layer; 40 n-type clad layer; 50 light-emitting layer; 60 p-type clad layer; 70 first electrode; 80 second electrode; 100 soda glass substrate; 201 silver film; 400 resist; 401 circular opening; 500 metal-based particle assembly layer-layered substrate; 501 substrate; 502 metal-based particle assembly layer; 600 objective lens; 700 spectrophotometer.

The invention claimed is:

1. An inorganic layer light-emitting device comprising:
a light-emitting layer including an emission body made of an inorganic material;
a metal-based particle assembly layer being a layer consisting of a particle assembly including 30 or more metal-based particles separated from each other and disposed in two-dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8,
said metal-based particles that compose said metal-based particle assembly layer being disposed such that an average distance between adjacent metal-based particles is in a range of from 1 to 150 nm.

2. The inorganic layer light-emitting device according to claim 1, wherein said metal-based particles that compose said metal-based particle assembly layer are oblate particles with said aspect ratio of more than 1.

3. The inorganic layer light-emitting device according to claim 1, wherein said metal-based particles that compose said metal-based particle assembly layer are made of silver.

4. The inorganic layer light-emitting device according to claim 1, wherein said metal-based particles that compose said metal-based particle assembly layer are non-conductive between adjacent metal-based particles.

5. The inorganic layer light-emitting device according to claim 1, wherein said metal-based particle assembly layer has in an absorption spectrum for a visible light region a maximum wavelength of a peak at a longest side in wavelength, and the maximum wavelength is in a range of from 350 to 550 nm.

6. The inorganic layer light-emitting device according to claim 1, wherein said metal-based particle assembly layer has in an absorption spectrum for a visible light region a maximum wavelength of a peak at a longest side in wavelength, and an absorbance at the maximum wavelength is at least 1.

7. The inorganic layer light-emitting device according to claim 1, further comprising an insulating layer interposed between said light-emitting layer and said metal-based particle assembly layer.

8. The inorganic layer light-emitting device according to claim 7, wherein said insulating layer is formed so as to cover a surface of each metal-based particle that composes said metal-based particle assembly layer.

9. The inorganic layer light-emitting device according to claim 1, wherein a thickness of said light-emitting layer is at least 1 nm.

10. The inorganic layer light-emitting device according to claim 1, wherein a distance between a light-emitting layer side surface of said metal-based particle assembly layer and said light-emitting layer is at least 10 nm.

11. The inorganic layer light-emitting device according to claim 1, wherein a distance between a light-emitting layer side surface of said metal-based particle assembly layer and said light-emitting layer is at least 20 nm, and said emission body contained in said light-emitting layer has a photoluminescence quantum yield of 1.5 times or larger than that of a reference inorganic layer light-emitting device that does not have said metal-based particle assembly layer.

12. An inorganic layer light-emitting device comprising:
a light-emitting layer including an emission body made of an inorganic material; and
a metal-based particle assembly layer being a layer consisting of a particle assembly including 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8,
said metal-based particle assembly layer having in an absorption spectrum for a visible light region a maximum wavelength of a peak at a longest side in wavelength, and the maximum wavelength shifts toward a shorter side in wavelength in a range of from 30 to 500 nm as compared with that of a reference metal-based particle assembly in which metal-based particles having a particle diameter equal to said average particle diameter and a height equal to said average height and made of the same material are disposed such that each distance between adjacent metal-based particles is in a range of from 1 to 2 μm.

13. The inorganic layer light-emitting device according to claim 12, wherein said metal-based particles that compose said metal-based particle assembly layer are oblate particles with said aspect ratio of more than 1.

14. The inorganic layer light-emitting device according to claim 12, wherein said metal-based particles that compose said metal-based particle assembly layer are made of silver.

15. The inorganic layer light-emitting device according to claim 12, wherein said metal-based particles that compose said metal-based particle assembly layer are non-conductive between adjacent metal-based particles.

16. The inorganic layer light-emitting device according to claim 12, wherein said metal-based particle assembly layer has in an absorption spectrum for a visible light region a maximum wavelength of a peak at a longest side in wavelength, and the maximum wavelength is in a range of from 350 to 550 nm.

17. The inorganic layer light-emitting device according to claim 12, wherein said metal-based particle assembly layer has in an absorption spectrum for a visible light region a maximum wavelength of a peak at a longest side in wavelength, and an absorbance at the maximum wavelength is at least 1.

18. The inorganic layer light-emitting device according to claim 12, further comprising an insulating layer interposed between said light-emitting layer and said metal-based particle assembly layer.

19. The inorganic layer light-emitting device according to claim 18, wherein said insulating layer is formed so as to cover a surface of each metal-based particle that composes said metal-based particle assembly layer.

20. The inorganic layer light-emitting device according to claim 12, wherein a thickness of said light-emitting layer is at least 1 nm.

21. The inorganic layer light-emitting device according to claim 12, wherein a distance between a light-emitting layer side surface of said metal-based particle assembly layer and said light-emitting layer is at least 10 nm.

22. The inorganic layer light-emitting device according to claim 12, wherein a distance between a light-emitting layer side surface of said metal-based particle assembly layer and said light-emitting layer is at least 20 nm, and said emission body contained in said light-emitting layer has a photoluminescence quantum yield of 1.5 times or larger than that of a reference inorganic layer light-emitting device that does not have said metal-based particle assembly layer.

23. An inorganic layer light-emitting device comprising:
a light-emitting layer including an emission body made of an inorganic material; and
a metal-based particle assembly layer being a layer consisting of a particle assembly including 30 or more metal-based particles separated from each other and disposed in two dimensions, said metal-based particles having an average particle diameter in a range of from 200 to 1600 nm, an average height in a range of from 55 to 500 nm, and an aspect ratio, as defined by a ratio of said average particle diameter to said average height, in a range of from 1 to 8,
said metal-based particle assembly layer having in an absorption spectrum for a visible light region a maximum wavelength of a peak at a longest side in wavelength, and an absorbance at the maximum wavelength is higher as compared with that of a reference metal-based particle assembly in which metal-based particles having a particle diameter equal to said average particle diameter and a height equal to said average height and made of the same material are disposed such that each distance between adjacent metal-based particles is in a range of from 1 to 2 μm, on the premise that the numbers of the metal-based particles are the same.

24. The inorganic layer light-emitting device according to claim 23, wherein said metal-based particles that compose said metal-based particle assembly layer are oblate particles with said aspect ratio of more than 1.

25. The inorganic layer light-emitting device according to claim 23, wherein said metal-based particles that compose said metal-based particle assembly layer are made of silver.

26. The inorganic layer light-emitting device according to claim 23, wherein said metal-based particles that compose said metal-based particle assembly layer are non-conductive between adjacent metal-based particles.

27. The inorganic layer light-emitting device according to claim 23, wherein said metal-based particle assembly layer has in an absorption spectrum for a visible light region a maximum wavelength of a peak at a longest side in wavelength, and the maximum wavelength is in a range of from 350 to 550 nm.

28. The inorganic layer light-emitting device according to claim 23, wherein said metal-based particle assembly layer has in an absorption spectrum for a visible light region a maximum wavelength of a peak at a longest side in wavelength, and an absorbance at the maximum wavelength is at least 1.

29. The inorganic layer light-emitting device according to claim 23, further comprising an insulating layer interposed between said light-emitting layer and said metal-based particle assembly layer.

30. The inorganic layer light-emitting device according to claim 29, wherein said insulating layer is formed so as to cover a surface of each metal-based particle that composes said metal-based particle assembly layer.

31. The inorganic layer light-emitting device according to claim 23, wherein a thickness of said light-emitting layer is at least 1 nm.

32. The inorganic layer light-emitting device according to claim 23, wherein a distance between a light-emitting layer side surface of said metal-based particle assembly layer and said light-emitting layer is at least 10 nm.

33. The inorganic layer light-emitting device according to claim 23, wherein a distance between a light-emitting layer side surface of said metal-based particle assembly layer and said light-emitting layer is at least 20 nm, and said emission body contained in said light-emitting layer has a photoluminescence quantum yield of 1.5 times or larger than that of a reference inorganic layer light-emitting device that does not have said metal-based particle assembly layer.

* * * * *